(12) United States Patent
Shibazaki

(10) Patent No.: US 8,325,326 B2
(45) Date of Patent: Dec. 4, 2012

(54) STAGE UNIT, EXPOSURE APPARATUS, AND EXPOSURE METHOD

(75) Inventor: Yuichi Shibazaki, Kamagaya (JP)

(73) Assignee: Nikon Corporation, Tokyo (JP)

( * ) Notice: Subject to any disclaimer, the term of this patent is extended or adjusted under 35 U.S.C. 154(b) by 311 days.

(21) Appl. No.: 12/801,897

(22) Filed: Jun. 30, 2010

(65) Prior Publication Data

US 2010/0283986 A1    Nov. 11, 2010

Related U.S. Application Data

(63) Continuation of application No. 11/628,199, filed as application No. PCT/JP2005/010315 on Jun. 6, 2005, now abandoned.

(30) Foreign Application Priority Data

Jun. 7, 2004 (JP) ................................ 2004-168481

(51) Int. Cl.
*G03B 27/32* (2006.01)
*G03B 27/42* (2006.01)
*G03B 27/52* (2006.01)
*G03B 27/58* (2006.01)
*G03B 27/62* (2006.01)
*H02K 41/02* (2006.01)

(52) U.S. Cl. ................ 355/72; 355/30; 355/53; 355/75; 355/77; 310/12.01; 310/12.29

(58) Field of Classification Search .............. 250/492.2; 310/12.01, 12.05–12.06, 12.13–12.14, 12.29; 318/649; 355/30, 53, 72, 75, 77

See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,780,617 A | 10/1988 | Umatate et al. | |
| 5,448,332 A | 9/1995 | Sakakibara et al. | |
| 5,610,683 A | 3/1997 | Takahashi et al. | |
| 5,623,853 A | 4/1997 | Novak et al. | |

(Continued)

FOREIGN PATENT DOCUMENTS

DE    221 563 A1    4/1985

(Continued)

OTHER PUBLICATIONS

Mar. 31, 2009 Office Action issued in U.S. Appl. No. 11/628,199.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

A power usage supply unit—that supplies power usage to a stage which moves on a movement surface has a first axis section, first support sections, a second axis section, and a second support section. The first axis section is movably supported by the first support section in a direction of the first axis and around the first axis, and the second axis section is movably supported by the second support section in a direction of the second axis and around the second axis. And, by employing a mechanism in which the power usage supply unit has at least four degrees of freedom, the power usage supply unit does not interfere with the movement of a stage even when the stage moves in the first and second axis directions and in the rotational direction of each axis, therefore, decrease in position controllability of the stage caused by dragging a tube can be completely avoided.

36 Claims, 21 Drawing Sheets

U.S. PATENT DOCUMENTS

| | | | |
|---|---|---|---|
| 5,715,039 | A | 2/1998 | Fukuda et al. |
| 5,825,043 | A | 10/1998 | Suwa |
| 5,874,820 | A | 2/1999 | Lee |
| 6,222,614 | B1 | 4/2001 | Ohtomo |
| 6,246,204 | B1 | 6/2001 | Ebihara et al. |
| 6,323,567 | B1 | 11/2001 | Hazelton et al. |
| 6,408,045 | B1 | 6/2002 | Matsui et al. |
| 6,583,597 | B2 | 6/2003 | Tanaka et al. |
| 6,693,402 | B2 | 2/2004 | Ebihara et al. |
| 6,740,891 | B2 | 5/2004 | Driessen et al. |
| 6,778,257 | B2 | 8/2004 | Bleeker et al. |
| 6,781,138 | B2 | 8/2004 | Novak et al. |
| 6,917,412 | B2 | 7/2005 | Poon et al. |
| 6,937,317 | B2 | 8/2005 | Morisada |
| 6,937,911 | B2 | 8/2005 | Watson |
| 7,557,529 | B2 | 7/2009 | Tanaka |
| 2002/0003616 | A1 | 1/2002 | Ebinuma et al. |
| 2002/0075467 | A1 | 6/2002 | Tanaka et al. |
| 2002/0075469 | A1 | 6/2002 | Tanaka |
| 2003/0030778 | A1 | 2/2003 | Novak |
| 2003/0137643 | A1 | 7/2003 | Jacobs et al. |
| 2004/0012768 | A1 | 1/2004 | Tanaka et al. |
| 2004/0051854 | A1 | 3/2004 | Tanaka et al. |
| 2004/0165159 | A1 | 8/2004 | Lof et al. |
| 2005/0024621 | A1 | 2/2005 | Korenaga |
| 2005/0219488 | A1 | 10/2005 | Nei et al. |
| 2008/0143994 | A1 | 6/2008 | Shibazaki |
| 2010/0283986 | A1 | 11/2010 | Shibazaki |

FOREIGN PATENT DOCUMENTS

| | | |
|---|---|---|
| DE | 224 448 A1 | 7/1985 |
| JP | A 58-202448 | 11/1983 |
| JP | A 59-019912 | 2/1984 |
| JP | A-61-44429 | 3/1986 |
| JP | A 62-065326 | 3/1987 |
| JP | A 63-157419 | 6/1988 |
| JP | A 4-305915 | 10/1992 |
| JP | A 4-305917 | 10/1992 |
| JP | A 5-062877 | 3/1993 |
| JP | A 6-124873 | 5/1994 |
| JP | A-6-283403 | 10/1994 |
| JP | A 7-220990 | 8/1995 |
| JP | A 8-063231 | 3/1996 |
| JP | A-8-63231 | 3/1996 |
| JP | A-8-233964 | 9/1996 |
| JP | A-8-316125 | 11/1996 |
| JP | A 8-316125 | 11/1996 |
| JP | A-8-330224 | 12/1996 |
| JP | A 8-330224 | 12/1996 |
| JP | A-10-223527 | 8/1998 |
| JP | A 10-303114 | 11/1998 |
| JP | A 10-340846 | 12/1998 |
| JP | A 11-176727 | 7/1999 |
| JP | A-11-189332 | 7/1999 |
| JP | A-2000-56051 | 2/2000 |
| JP | A 2000-058436 | 2/2000 |
| JP | A 2001-7015 | 1/2001 |
| JP | A 2001-20951 | 1/2001 |
| JP | A-2001-218443 | 8/2001 |
| JP | A-2002-43213 | 2/2002 |
| JP | A-2002-134390 | 5/2002 |
| JP | A 2002-198284 | 7/2002 |
| JP | A-2002-198310 | 7/2002 |
| JP | A-2002-208562 | 7/2002 |
| JP | A-2002-343706 | 11/2002 |
| JP | A-2002-353118 | 12/2002 |
| JP | A-2003-203862 | 7/2003 |
| JP | A-2003-209962 | 7/2003 |
| JP | A-2004-95653 | 3/2004 |
| JP | A-2004-095705 | 3/2004 |
| JP | U 3102327 | 3/2004 |
| JP | A-2004-134682 | 4/2004 |
| JP | A-2004-140145 | 5/2004 |
| JP | A 2004-193425 | 7/2004 |
| JP | A-2004-193425 | 7/2004 |
| WO | WO 99/49504 | 9/1999 |
| WO | WO 01/35168 A1 | 5/2001 |
| WO | WO 2004/19128 A2 | 3/2004 |
| WO | WO 2004/053953 A1 | 6/2004 |
| WO | WO 2005/098911 A1 | 10/2005 |

OTHER PUBLICATIONS

Dec. 30, 2009 Office Action issued in U.S. Appl. No. 11/628,199.
Jul. 16, 2008 Office Action issued in U.S. Appl. No. 11/593,484.
Mar. 16, 2009 Notice of Allowance issued in U.S. Appl. No. 11/593,484.
Sep. 13, 2005 International Search Report issued in PCT/JP2005/010315 (with translation).
Sep. 13, 2005 Written Opinion of the International Searching Authority for PCT/JP2005/010315 (with translation).
Aug. 31, 2010 Office Action issued in Japanese Patent Application No. 2006-514487 (with translation).
Nov. 24, 2010 Notice of Allowance issued in Japanese Patent Application No. 2006-514487 (with translation).
Dec. 1, 2010 Office Action issued in European Patent Application No. 05 750 923.4.
Dec. 29, 2011 Office Action in U.S. Appl. No. 12/588,007.
Taiwanese Patent Office, Official Letter mailed Feb. 24, 2012 in Taiwanese Patent Application No. 0941 18673 w/English-language Translation.
Supplementary European Search issued in corresponding EP Application No. 05750923 on Oct. 22, 2009.
U.S. Appl. No. 11/547,245, filed Nov. 28, 2006 in the name of Yuichi Shibazaki.
May 26, 2011 Office Action issued in Korean Application No. 10-2007-7000359 with English Translation.
Jul. 27, 2012 Office Action issued in European Patent Application No. 05750923.4.

STAGE UNIT, EXPOSURE APPARATUS, AND EXPOSURE METHOD

This is a Continuation of application Ser. No. 11/628,199 filed Dec. 1, 2006, which is a National Stage of PCT/JP2005/010315 filed Jun. 6, 2005, which claims the benefit of JP Patent Application No. 2004-168481 filed Jun. 7, 2004. The entire disclosures of the prior applications are hereby incorporated by reference herein in their entirety.

TECHNICAL FIELD

The present invention relates to stage units, exposure apparatus, and exposure methods, and more particularly to a stage unit (stage device) that has a stage which moves on a movement surface, an exposure apparatus that is equipped with the stage unit, and an exposure method in which a pattern is formed by exposing a substrate on the stage.

BACKGROUND ART

In recent years, in a lithographic process to produce a semiconductor, a liquid crystal display device or the like, due to higher integration of semiconductors or the like, the sequentially moving type exposure apparatus is mainly used, such as the reduction projection exposure apparatus based on a step-and-repeat method (the so-called stepper) that can form a fine pattern on a photosensitive object with good accuracy and high throughput, the scanning projection exposure apparatus based on a step-and-scan method (the so-called scanning stepper (also called a scanner)) or the like.

In these types of exposure apparatus, as a drive unit for driving a photosensitive object such as a wafer or a glass plate (hereinafter referred to as a "wafer"), a wafer stage unit of a coarse/fine movement structure has been used, which has an XY stage supported by levitation by air bearings or the like on a platform and is driven within a two-dimensional plane by a two-axis linear motor, and a wafer table that holds a wafer on the XY stage and is finely driven in a Z-axis direction and a direction of inclination by voice coil motors or the like. Further, a wafer stage unit that is equipped with a single stage driven in directions of six degrees of freedom by linear motors or voice coil motors is also recently being developed.

However, in the wafer stage units referred to above, because wiring used in the linear motors or voice coil motors, piping (tubes) used in the air bearings or the like connects from the outside to the stage, the wiring, piping or the like was dragged along with the drive of the stage, which caused a decrease in position controllability of the wafer.

In order to improve such an inconvenience, for example, a moving magnet type linear motor can be used for driving the stage and pressurized gas for supporting the stage on the platform by levitation can also be supplied from the platform side, which allows the wiring, piping or the like connecting to the stage to be removed (for example, refer to Patent Document 1).

However, although it is relatively easy to employ the structure according to Patent Document 1 in which pressurized gas is supplied from the platform side to the stage side in a stage which is scanned in an uniaxial direction (e.g. scanning direction) such as in a reticle stage in the scanner, it is difficult to employ the structure in a wafer stage to which two-dimensional movement is essential. Therefore, in a wafer stage unit, the piping for supplying pressurized gas had to be connected to the stage, which left the piping dragging and still being a cause in the decrease in position controllability of the stage. As a matter of course, in the case piping inevitably has to be connected to the reticle stage also in a reticle stage unit, there is a similar risk of a decrease in position controllability.

Patent Document 1: Kokai (Japanese Unexamined Patent Application Publication) No. 2001-20951

DISCLOSURE OF INVENTION

Means for Solving the Problems

The present invention was made under the circumstances described above, and according to a first aspect of the present invention, there is provided a first stage unit that has a stage which moves on a movement surface and a power usage supply unit which supplies power usage to the stage wherein the power usage supply unit comprises: a first axis section that extends in a direction of a first axis within the movement surface; a first support section that movably supports the first axis section in the direction of the first axis and around the first axis; a second axis section that extends in a direction of a second axis intersecting with the first axis; and a second support section that movably supports the second axis section in the direction of the second axis and around the second axis.

According to this unit, the power usage supply unit which supplies power usage to the stage that moves on the movement surface comprises the first axis section, the first support section, the second axis section, and the second support section, and the first axis section is movably supported by the first support section within the movement surface in the direction of the first axis and around the first axis, while the second axis section is movably supported by the second support section within the movement surface in the direction of the second axis intersecting with the first axis and around the second axis. Accordingly, even if a force in a direction of the four degrees of freedom (the direction of the first axis, the rotational direction around the first axis, the direction of the second axis, and the rotational direction around the second axis) acts on the power usage supply unit due to the movement of the stage, the power usage supply unit absorbs the force by changing its position and attitude according to the force. Therefore, by connecting the power usage supply unit to the stage, the position controllability does not decrease due to dragging a tube as in the case when piping such as a tube are used for supplying power usage, and the position controllability of the stage can be favorably secured.

In this case, the power usage supply unit can further comprise: a third axis section that extends in a direction of a third axis intersecting with the first axis and the second axis; and a third support section that movably supports the third axis section in the direction of the third axis and around the third axis. In such a case, even if a force in any direction acts on the power usage supply unit, because the power usage supply unit can change its position and attitude according to the force, the position controllability of the stage can be secured more favorably.

According to a second aspect of the present invention, there is provided a second stage unit, the unit comprising: a stage movably supported on a movement surface; a first drive unit that drives the stage; a counter mass that moves in an opposite direction of the stage by the reaction force caused when the first drive unit drives the stage; and a power usage supply unit that supplies power usage to the stage via the counter mass.

According to this unit, the stage movably supported on the movement surface comprises the power usage supply unit that supplies power usage to the stage via the counter mass that moves in the opposite direction of the stage by the reaction force caused when the first drive unit drives the stage. Therefore, the power usage supply to the stage is performed relaying the counter mass located near the stage. Accordingly, when comparing the case with when the power usage (fluid) is supplied to the stage directly from outside the stage unit via piping such as tubes, the resisting force that accompanies the dragging of a tube can be reduced, which makes it possible to improve the position controllability of the stage.

According to a third aspect of the present invention, there is provided a first exposure apparatus that transfers a pattern of a mask mounted on a stage unit onto a substrate wherein a stage unit according to one of the first and second stage units is used as the stage unit.

According to this apparatus, one of the first and second stage units is used as the stage unit that moves the mask, therefore, the position controllability of the mask can be improved, and as a consequence, position alignment (or overlay) of the pattern formed on the mask and the substrate becomes favorable, and it becomes possible to transfer the pattern onto the substrate with high precision.

According to a fourth aspect of the present invention, there is provided a second exposure apparatus that forms a pattern by exposing a substrate mounted on a stage unit wherein a stage unit according to one of the first and second stage units is used as the stage unit.

According to this apparatus, one of the first and second stage units of the present invention is used as the stage unit that moves the substrate, therefore, the position controllability of the substrate can be improved, and as a consequence, it becomes possible to transfer the pattern onto the substrate with high precision.

According to a fifth aspect of the present invention, there is provided an exposure method in which a pattern is formed by exposing a substrate on a stage with a unit comprising a power usage supply unit that supplies power usage to the stage which moves within a two dimensional plane wherein the power usage supply unit is moved in a first axis direction within the two dimensional plane and also around the first axis, and the power usage supply unit is moved in a second axis direction intersecting with the first axis and also around the second axis.

According to this method, the power usage supply unit that supplies power usage to the stage which moves within the two dimensional plane moves in directions of four degrees of freedom (the direction of the first axis, the rotational direction around the first axis, the direction of the second axis, and the rotational direction around the second axis), which allows the power usage supply unit to follow the stage when it moves. Therefore, the position controllability does not decrease due to dragging a tube as in the case when piping such as tubes are used for supplying power usage, and the position controllability of the stage can be favorably secured, which makes it possible to increase the exposure accuracy.

BEST MODE FOR CARRYING OUT THE INVENTION

A First Embodiment

A first embodiment of the present invention is described below, referring to FIGS. 1 to 12B.

Figure 1:
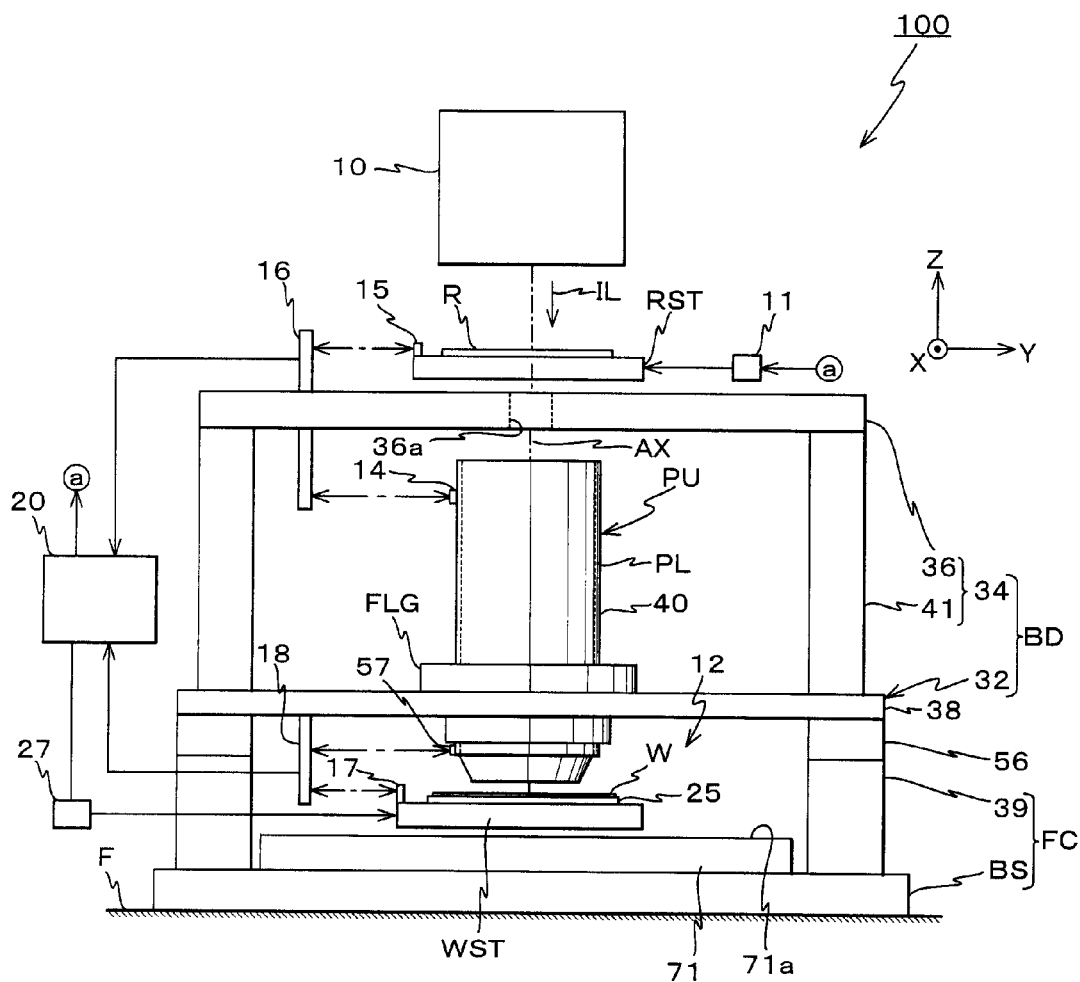
FIG. 1 is a schematic view of an arrangement of an exposure apparatus related to a first embodiment.

FIG. 1 is an entire view of an arrangement of an exposure apparatus 100 related to the first embodiment. Exposure apparatus 100 is a scanning exposure apparatus based on a step-and-scan method, that is, the so-called scanning stepper.

Exposure apparatus 100 is equipped with an illumination system 10 that includes a light source and an illumination optical system and illuminates an illumination light (exposure light) IL serving as an energy beam on a reticle R serving as a mask, a reticle stage RST that holds reticle R, a projection unit PU, a wafer stage unit 12 serving as a stage unit (stage device) that includes a wafer stage WST on which a wafer W serving as an object is mounted, a body BD in which reticle stage RST and projection unit PU is installed, a control system for these parts and the like.

Illumination system 10 illuminates a slit-shaped illumination area set by a reticle blind (not shown) on reticle R with illumination light IL at a substantially uniform illuminance.

In this case, for example, an ArF excimer laser beam (wavelength: 193 nm) is used as illumination light IL.

Reticle stage RST is supported by levitation above a reticle base 36 that constitutes a top plate of a second column 34 which will be described later, by air bearings or the like (not shown) arranged on the bottom surface of reticle stage RST via a clearance of, for example, around several μm. On reticle stage RST, reticle R is fixed, for example, by vacuum suction (or by electrostatic suction). In this case, reticle stage RST can be finely driven two dimensionally within an XY plane (in an X-axis direction, a Y-axis direction and a rotational direction (θz direction) around a Z-axis orthogonal to the XY plane) perpendicular to an optical axis AX of a projection optical system PL (to be described later) by a reticle stage drive section 11, which includes a linear motor or the like, and can also be driven on reticle base 36 in a predetermined scanning direction (in this case, the Y-axis direction which is the lateral direction of the page surface in FIG. 1) at a designated scanning speed. Reticle stage RST can employ the known coarse/fine movement structure.

In the case of the embodiment, measures are taken to reduce the influence of vibration due to reaction forces acting on stators of the linear motor when reticle stage RST is driven (especially during scanning drive) as much as possible. More specifically, as is disclosed in, for example, Kokai (Japanese Patent Unexamined Application Publication) No. 8-330224, the corresponding U.S. Pat. No. 5,874,820 and the like, the stators of the linear motor are each supported by a support member (a reaction frame) (not shown) arranged separately from body BD, and the reaction forces that act on the stators of the linear motor when reticle stage RST is driven is to be transmitted (released) to a floor surface F of the clean room via the reaction frame. Besides such a method, a reaction canceling mechanism that uses the law of conservation of momentum as is disclosed in, for example, Kokai (Japanese Unexamined Patent Application Publication) No. 08-63231 and the corresponding U.S. Pat. No. 6,246,204 and the like, can also be employed as the reaction canceling mechanism of reticle stage RST. As long as the national laws in designated states (or elected states), on which this international application is applied, permit, the above disclosures of each of the publications and their corresponding U.S. patents are incorporated herein by reference.

The position of reticle stage RST within a stage movement surface is constantly detected by a reticle laser interferometer (hereinafter referred to as "reticle interferometer") 16 via a movable mirror 15 at a resolution of, for example, around 0.5 to 1 nm. In this case, position measurement is performed, with a fixed mirror 14 fixed to the side surface of a barrel 40 that makes up projection unit PU serving as a reference. On reticle stage RST, a Y movable mirror that has a reflection surface orthogonal to the Y-axis direction and an X movable mirror that has a reflection surface orthogonal to the X-axis direction are actually arranged, and a reticle Y interferometer and a reticle X interferometer are also arranged corresponding to the movable mirrors, and furthermore, corresponding to the interferometers, a fixed mirror for position measurement in the X-axis direction and a fixed mirror for position measurement in the Y-axis direction are arranged, however, in FIG. 1 these are representatively indicated as movable mirror 15, reticle interferometer 16, and fixed mirror 14.

The measurement values of reticle interferometer 16 are sent to a main controller 20. Main controller 20 drives and controls reticle stage RST via reticle stage drive section 11, based on the measurement values of reticle interferometer 16.

Projection unit PU is held by a part of body BD, below reticle stage RST in FIG. 1. Body BD is equipped with a first column 32 arranged on a frame caster FC placed on floor surface F of the clean room and the second column 34 fixed on the first column 32.

Frame caster FC is equipped with a base plate BS laid horizontally on floor surface F, and a plurality of, e.g. three (or four), leg sections 39 (however, the leg section in the depth of the page surface of FIG. 1 is omitted in the drawings) fixed on base plate BS.

The first column 32 is equipped with a barrel platform (main frame) 38, which is supported substantially horizontally by a plurality of, e.g. three (or four), first vibration isolation mechanisms 56 fixed individually on the upper end of the plurality of leg sections 39 that constitutes frame caster FC.

In barrel platform 38, a circular opening (not shown) is formed substantially in the center, and in the circular opening, projection unit PU is inserted from above and is held via a flange FLG arranged on the outer circumferential section. On the upper surface of barrel platform 38, at positions surrounding projection unit PU, one end (the lower end) of a plurality of, e.g. three (or four), legs 41 (however, the leg in the depth of the page surface of FIG. 1 is omitted in the drawings) is fixed. The other end (the upper end) of these legs 41 is substantially flush on a horizontal surface, and on each of the upper end surface of legs 41, the lower surface of reticle base 36 described earlier is fixed. In the manner described above, the plurality of legs 41 horizontally supports reticle base 36. That is, the second column 34 is configured by reticle base 36 and legs 41 supporting reticle base 36. In reticle base 36, an opening 36a, which serves as a path for illumination light IL, is formed in the center.

Projection unit PU is configured by barrel 40 that has a cylinder hollow shape and has flange FLG arranged on the outer periphery in the vicinity of the lower end section, and projection optical system PL consisting of a plurality of optical elements held in barrel 40.

As projection optical system PL, for example, a dioptric system is used consisting of a plurality of lenses (lens elements) that share optical axis AX in the Z-axis direction. Projection optical system PL is, for example, a both-side telecentric dioptric system that has a predetermined projection magnification (such as one-quarter or one-fifth times). Therefore, when illumination light IL from illumination system 10 illuminates the illumination area on reticle R with illumination light IL that has passed through reticle R, a reduced image of the circuit pattern within the illumination area of reticle R (a partial reduced image of the circuit pattern) is formed on wafer W whose surface is coated with a resist (a photosensitive agent) via projection optical system PL. Wafer W is, for example, a disc-shaped substrate such as a semiconductor (silicon or the like) or an SOI (Silicon Insulator), and a resist is coated on the substrate.

Figure 2:
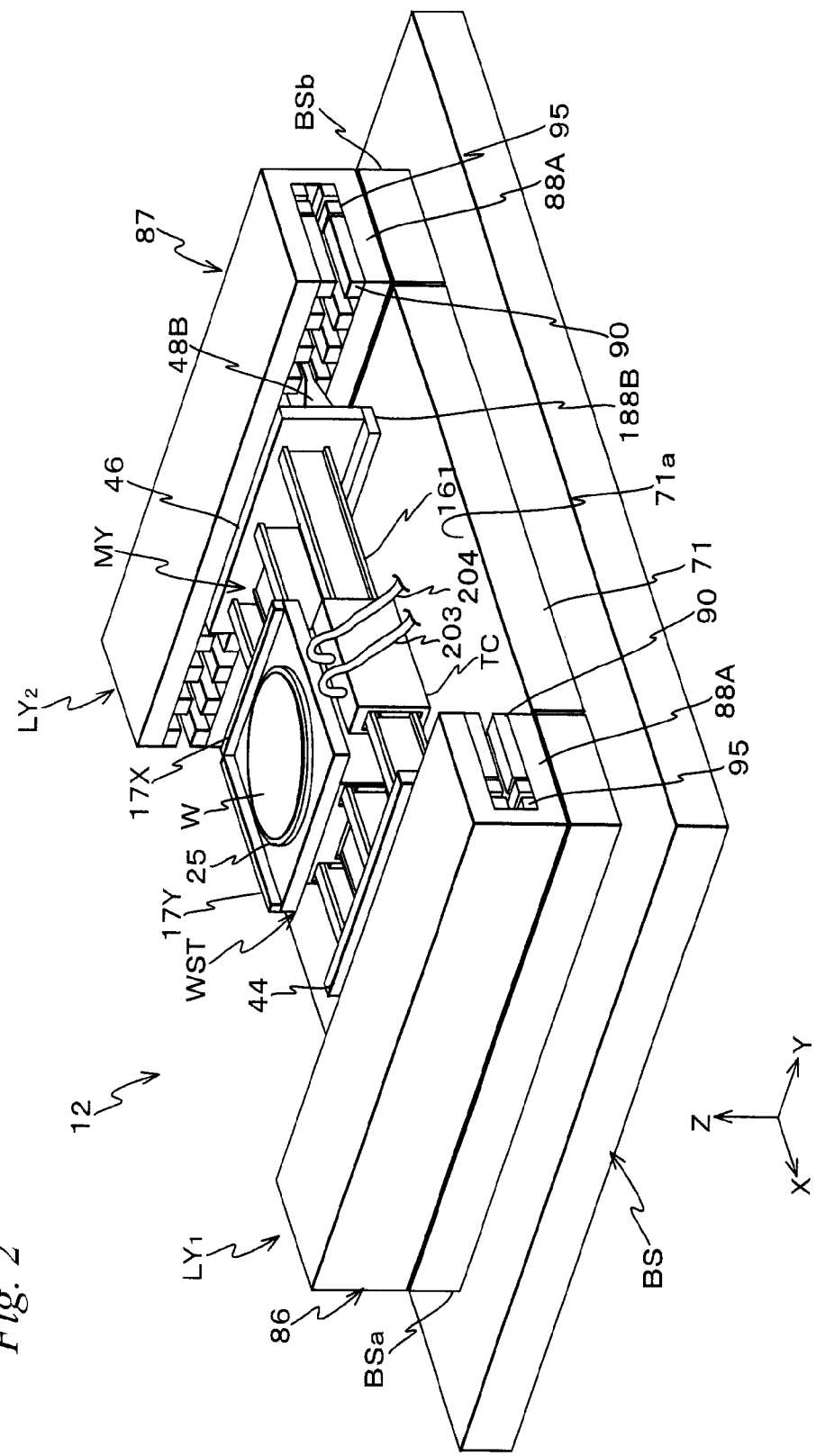
FIG. 2 is a perspective view of a wafer stage unit 12 in FIG. 1.

As is shown in the perspective view in FIG. 2, wafer stage unit 12 is equipped with a stage base 71, which is supported substantially horizontally by a plurality of (e.g. three) second vibration isolation mechanisms (omitted in drawings) placed on base plate BS, wafer stage WST placed above the upper surface of stage base 71, a tube carrier TC arranged on the +Y side of the wafer stage, a stage drive section that drives parts such as wafer stage WST and tube carrier TC, and the like. The stage drive is configured including a plurality of motors, which include a pair of Y-axis linear motors $LY_1$ and $LY_2$ shown in FIG. 2, however, in FIG. 1, the drive section is shown simply as a block as stage drive section 27, for the sake of simplicity in the drawings.

Details on wafer stage unit 12 will now be described, referring to FIGS. 2 to 7.

Stage base 71 is also called a platform, and is made of a flat plate that has a rectangular shape in a planar view (when viewed from above). Stage base 71 is placed in an area between protruded sections BSa and BSb, which are arranged in the vicinity of both edges of base plate BS in the X-axis direction extending in the Y-axis direction. The degree of flatness of the upper surface of stage base 71 is extremely high, and the upper surface serves as a movement surface when wafer stage WST moves.

Figure 3A:
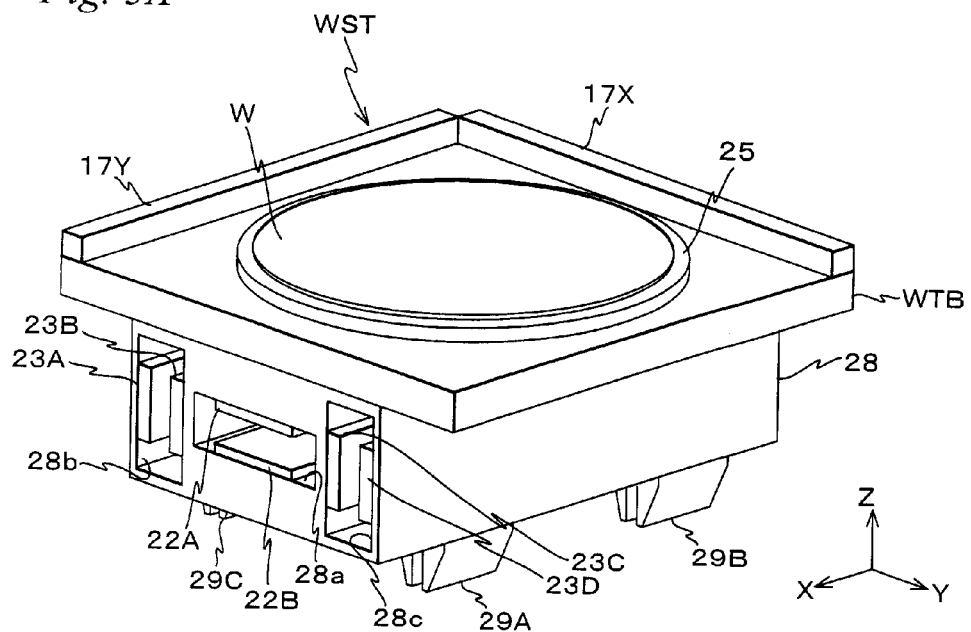
FIG. 3A is a perspective view of a wafer stage.

As it can be seen from FIG. 3A, which is a perspective view of wafer stage WST that has been taken out, wafer stage WST is equipped with a rectangular solid shaped wafer stage main body 28, and a wafer table WTB fixed on the upper surface of wafer stage main body 28 by vacuum suction.

In wafer stage main body 28, three openings 28a, 28b, and 28c that have a rectangular sectional shape are formed penetrating wafer stage main body 28 from the edge on the +X side to the edge on the −X side.

On the inner side of opening 28a on the vertical opposing surfaces, a pair of permanent magnets 22A and 22B, serving as a Y-axis mover, is respectively fixed.

On the inner side of openings 28b and 28c on the lateral opposing surfaces, magnetic pole units (a permanent magnet group) 23A to 23D, serving as X-axis movers, are respectively fixed.

Furthermore, in the vicinity of the four corners of the bottom surface of wafer stage main body 28, magnetic pole units (permanent magnets) 29A to 29D (however, magnetic pole unit 29D in the depth of the page surface is not shown) that have a triangular sectional shape are arranged. Details regarding magnetic pole units 29A to 28D will be given further, later in the description.

Figure 3B:
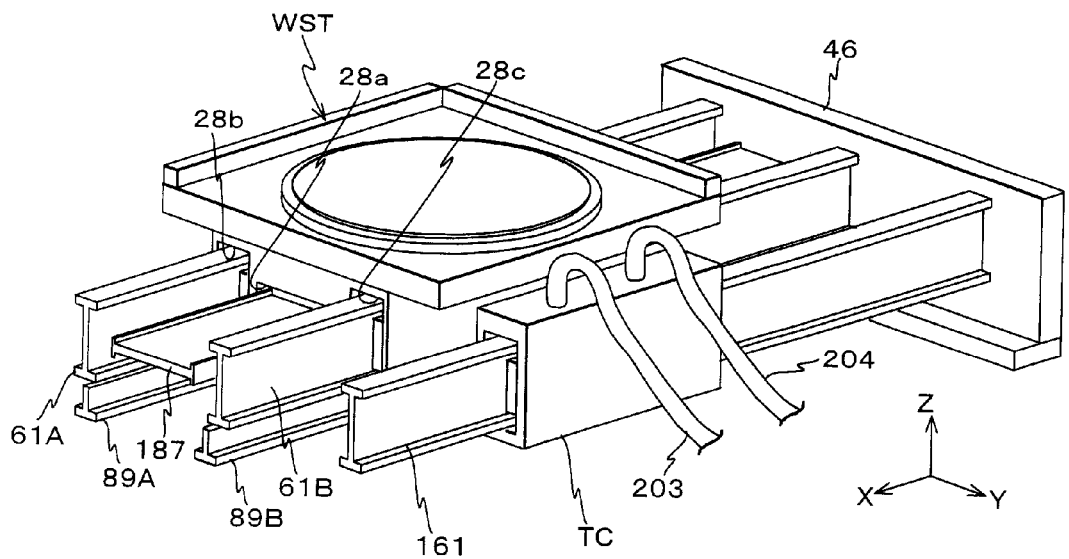
FIG. 3B is a view that shows a state in which the wafer stage in FIG. 3A is engaged with a stator that constitutes a moving body unit.

As is shown in the perspective views of FIGS. 2 and 3B, wafer stage main body 28 is in a state engaged with a plurality of stators (armature coils) extending in the X-axis direction.

Figure 4:
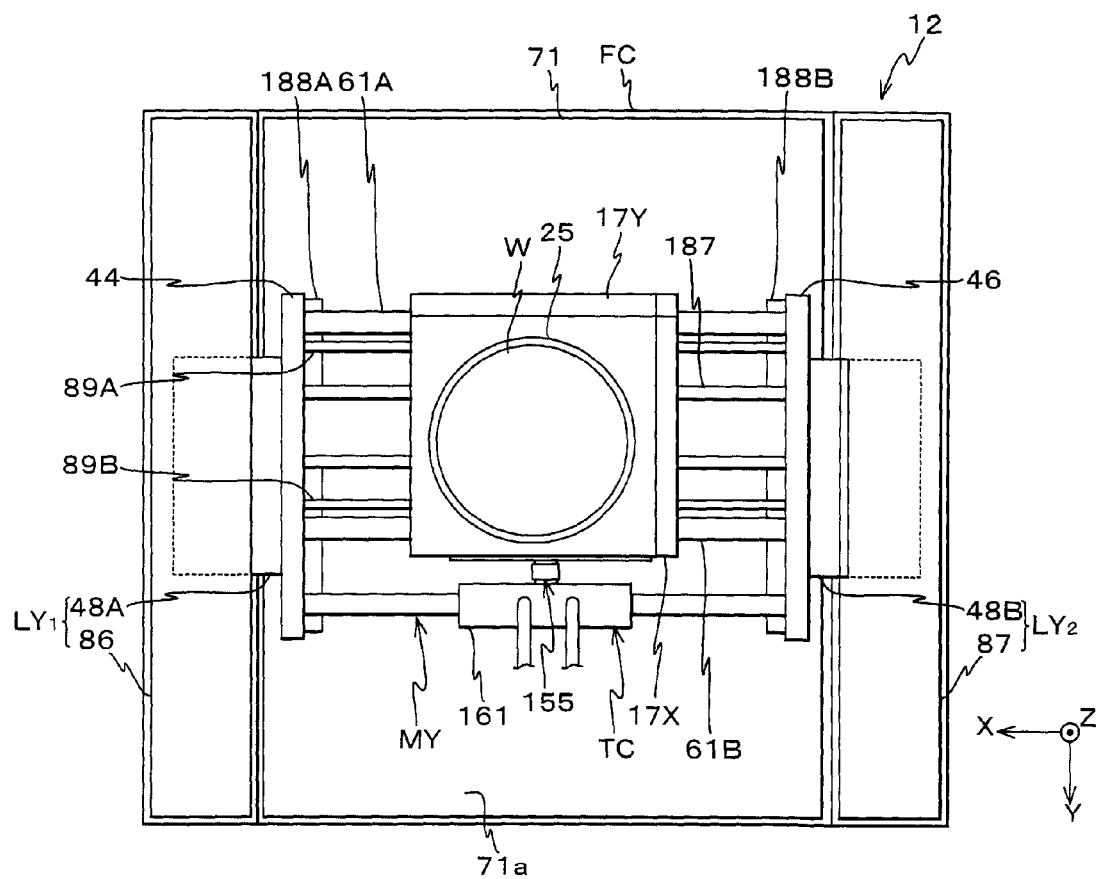
FIG. 4 is a planar view of wafer stage unit 12.

More specifically, as the plurality of stators (armature coils), as is shown in FIGS. 3B and 4 (a planar view that shows a wafer stage unit), a Y-axis stator 187, X-axis stators 61A, 61B, and 161, and Z-axis stators 89A and 89B are arranged. The edge surface on the −X side of these six stators are each fixed to a plate shaped slider 46 which is placed substantially parallel to a YZ plane, and the edge surface on the +X side of these six stators are each fixed to a plate shaped slider 44 which is placed substantially parallel to the YZ plane (refer to FIGS. 2 and 4). That is, sliders 44 and 46 and the six stators above constitute a stator unit MY.

Figure 5:
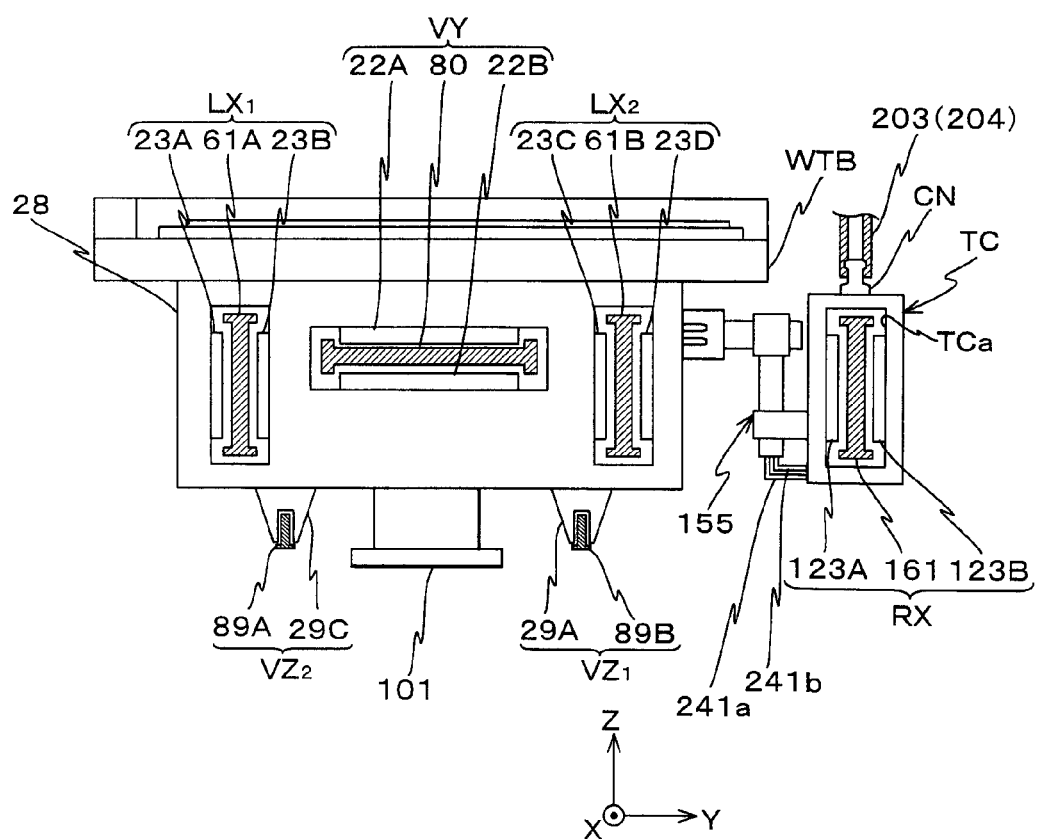
FIG. 5 is an XZ sectional view of a component part including a stator unit MY, a wafer stage WST movably engaged with stator unit MY, and a tube carrier TC.
Figure 6:
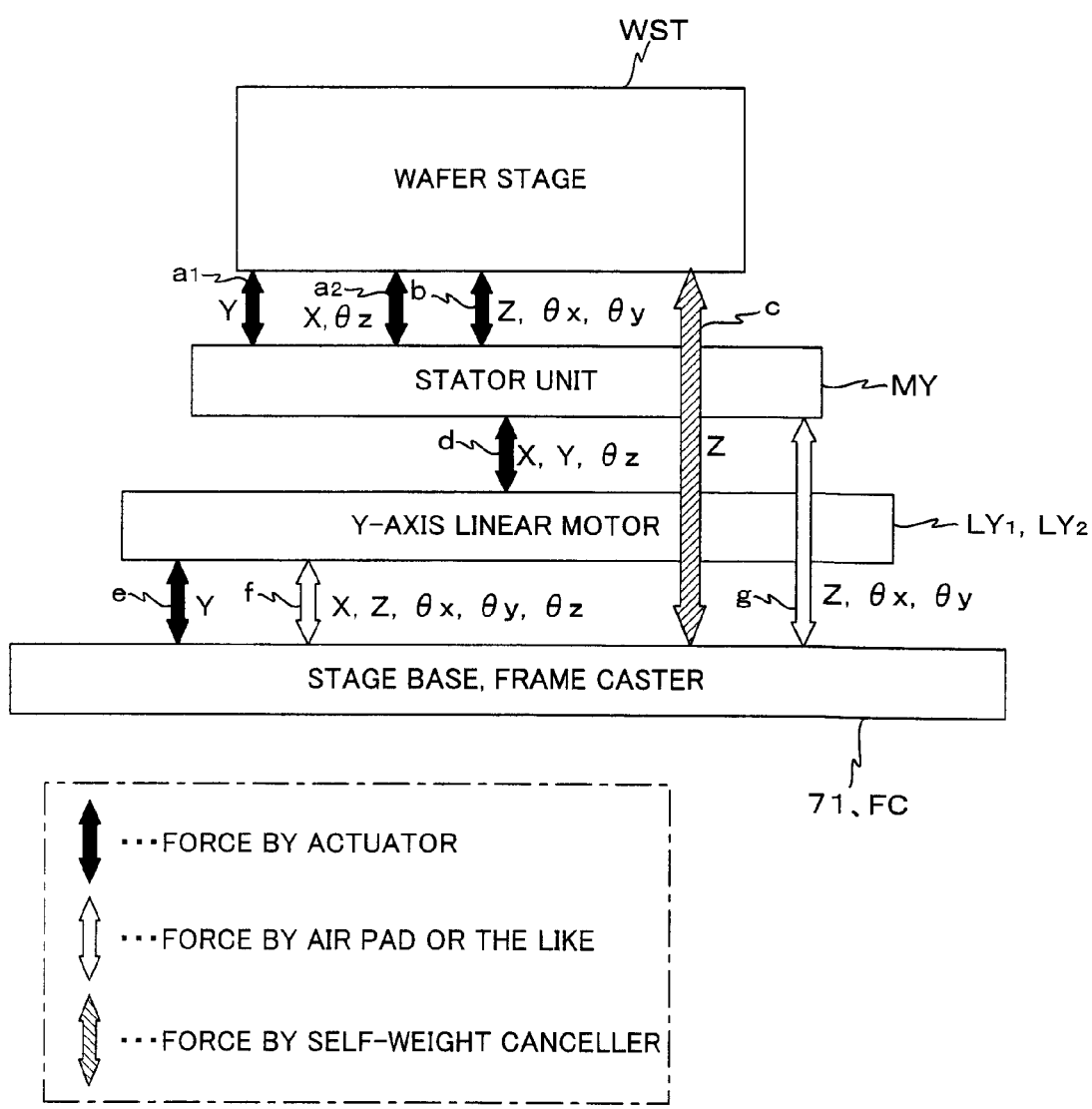
FIG. 6 is a view that models forces generated within the wafer stage unit.
Figure 8:
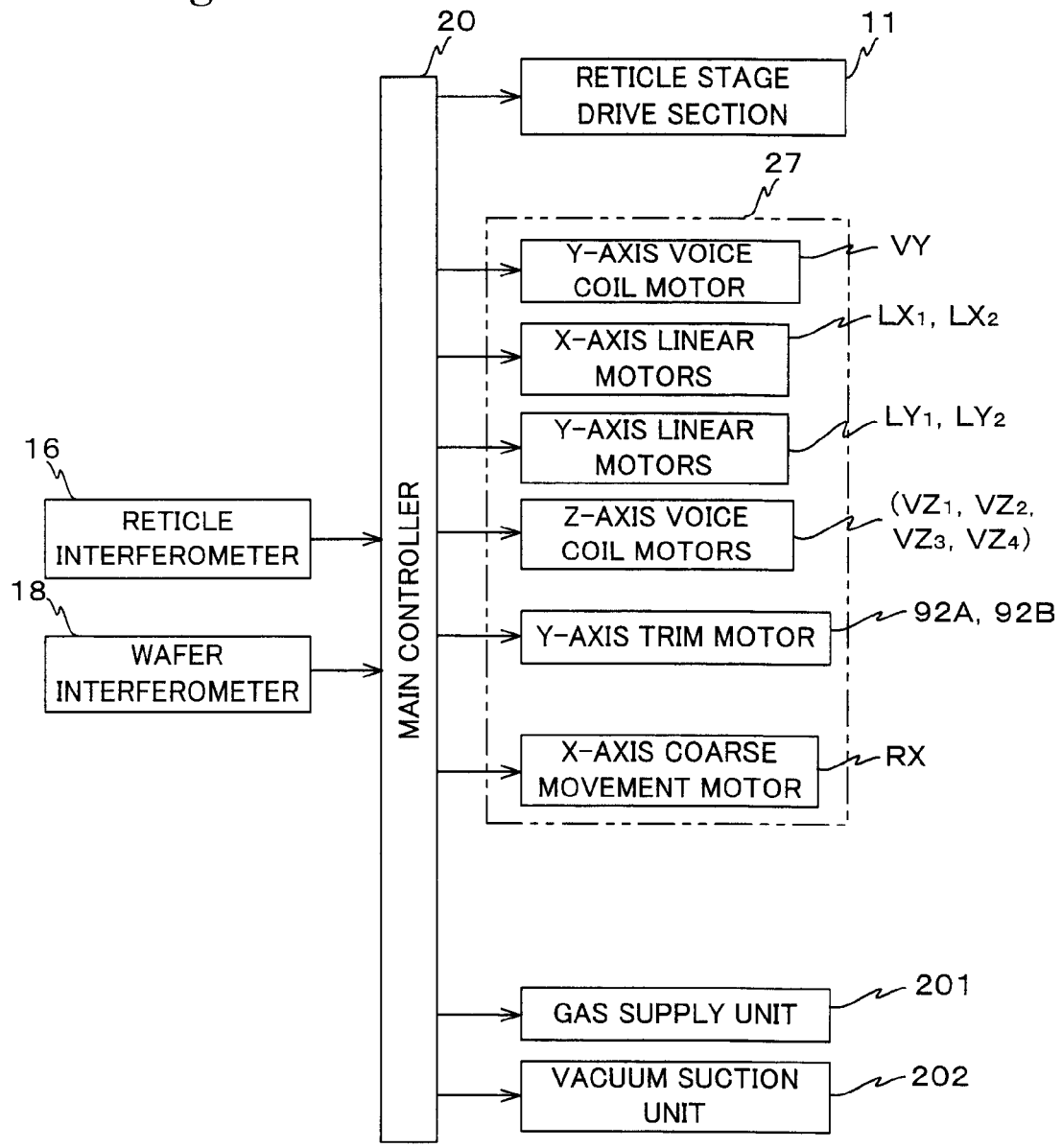
FIG. 8 is a block diagram of a control system in the first embodiment.

In the embodiment, Y-axis stator 187 and the pair of permanent magnets 22A and 22B constitute a moving magnet type Y-axis voice coil motor VY that finely drives wafer stage WST in the Y-axis direction with respect to stator unit MY (refer to FIGS. 5, 8 and the double pointing arrow (two-way arrow) $a_1$ in FIG. 6, which models the force generated within wafer stage unit 12).

Further, stator 61A and the pair of magnetic pole units 23A and 23B constitute a moving magnet type X-axis linear motor $LX_1$ that drives wafer stage WST in the X-axis direction with respect to stator unit MY, and stator 61B and the pair of magnetic pole units 23C and 23D constitute a moving magnet type X-axis linear motor $LX_2$ (refer to FIGS. 5 and 8).

In this case, by making the Lorentz force generated in X-axis linear motors $LX_1$ and $LX_2$ the same, wafer WST is driven in the X-axis direction by X-axis linear motors $LX_1$ and $LX_2$, and also by making the Lorentz force generated in X-axis linear motors $LX_1$ and $LX_2$ differ slightly, wafer stage WST is driven in the rotational direction around the Z-axis (the θz direction) by X-axis linear motors $LX_1$ and $LX_2$ (refer to the double pointing arrow $a_2$ in FIG. 6).

Furthermore, as is shown in FIG. 5, magnetic pole units 29A and 29B and magnetic pole units 29C and 29D that are fixed to the bottom surface of wafer stage main body 28 are respectively in an engaged state with Z-axis stators 89A and 89B. Z-axis stators 89A and 89B each resemble the letter T turned upside down in the YZ section, and inside Z-axis stators 89A and 89B, armature coils (not shown) are arranged.

Magnetic pole unit 29A and Z-axis stator 89B constitute a Z-axis voice coil motor $VZ_1$ (refer to FIGS. 5 and 8) that gives a drive force to wafer stage WST in the Z-axis direction, and similarly, magnetic pole unit 29B and Z-axis stator 89B constitute a Z-axis voice coil motor $VZ_2$ (refer to FIG. 8) that gives a drive force to wafer stage WST in the Z-axis direction.

Similarly, magnetic pole unit 29C and Z-axis stator 89A constitute a Z-axis voice coil motor $VZ_3$ (refer to FIGS. 5 and 8) that gives a drive force to wafer stage WST in the Z-axis direction, and similarly, magnetic pole unit 29D and Z-axis stator 89A constitute a Z-axis voice coil motor $VZ_4$ (refer to FIG. 8) that gives a drive force to wafer stage WST in the Z-axis direction.

That is, by appropriately controlling Z-axis voice coil motors $VZ_1$ to $VZ_4$, wafer stage WST can be driven in the Z, θx, and θy directions with respect to stator unit MY (refer to the double pointing arrow b in FIG. 6).

The self-weight of wafer stage WST is supported in a non-contact manner on a movement surface 71a of stage base 71 (refer to the double pointing arrow c in FIG. 6) by a supporting force of a self-weight canceller 101 arranged on the bottom surface of wafer stage WST, as is shown in FIG. 5. As self-weight canceller 101, as an example, a unit that has a cylinder fixed facing downward on the bottom surface of wafer stage main body 28 and a piston inserted into the cylinder from below, and is structured having a static gas bearing (a thrust bearing) arranged on the bottom surface of the piston communicating with a positive pressure space formed inside the cylinder between the cylinder and the upper end surface of the piston can be used. In this case, a radial bearing composed of a static gas bearing is preferably arranged between the outer circumferential surface of the piston and the inner circumferential surface of the cylinder. As self-weight canceller 101, for example, a bellows type self-weight canceller can be used.

As is shown in FIGS. 3B and 5, stator 161 engages with tube carrier TC, which has a rectangular frame shape when viewed from the +X (or −X) side. On the inner surface inside an opening section TCa of tube carrier TC on the +X side and the −X side, magnetic pole units 123A and 123B similar to magnetic pole units 23A and 23B described earlier are fixed. In the embodiment, stator 161 and the pair of magnetic pole units 123A and 123B constitute a moving magnet type X-axis linear motor RX (refer to FIGS. 5 and 8) that drives tube carrier TC in the X-axis direction with respect to stator unit MY. As moving magnet type X-axis linear motor RX described above, a moving coil type linear motor can also be employed.

As is shown in FIGS. 3B and 5, one end of a gas supply pipe 203 and a discharge pipe 204 connects to tube carrier TC, via connector CN, respectively.

Between tube carrier TC and wafer stage WST (wafer stage main body 28), a power usage supply unit 155 is arranged which connects tube carrier TC to wafer stage WST. The configuration of power usage supply unit 155 will be described later, along with the configuration of a supply system of pressurized gas and a supply system of vacuum power usage (vacuum discharge system) to wafer stage WST.

On each of the bottom surfaces of sliders 44 and 46, plate shape members 188A and 188B are arranged as is shown in FIG. 4. On the bottom surface of plate shape members 188A and 188B, a plurality of air bearings (not shown) are arranged along the Y-axis direction. And via the plurality of air bearings, sliders 44 and 46 are supported by levitation in a non-contact manner with respect to movement surface 71*a* of stage base 71 via a clearance of around several μm. Further, because the plurality of air bearings is disposed along the Y-axis direction, by making the levitation force of each air bearing differ, a force in the rotational direction around the X-axis (the θx direction) can be made to act on sliders 44 and 46, and further, by making the levitation force of sliders 44 and 46 different, the whole stator unit MY can be finely driven in a rotational direction around the Y-axis (the θy direction) (refer to the double pointing arrow g in FIG. 6).

As it can be seen when viewing FIGS. 4 and 2 together, Y-axis linear motors $LY_1$ and $LY_2$ are composed of Y-axis movers 48A and 48B consisting of armature units and Y-axis stators 86 and 87 consisting of magnetic pole units.

Figure 7:
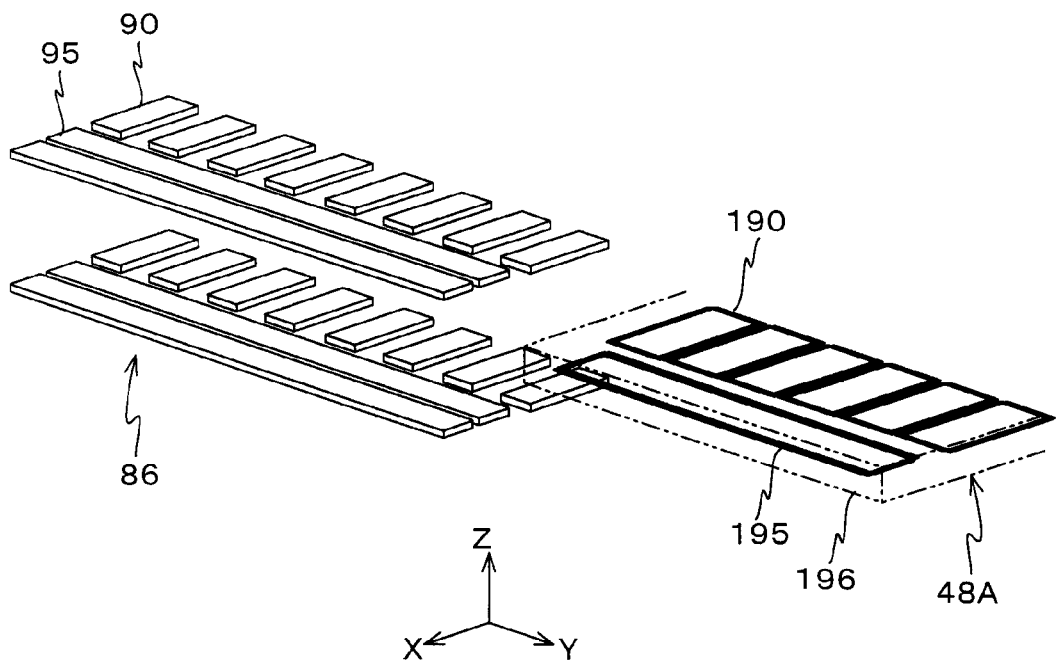
FIG. 7 is a perspective view that schematically shows the inner arrangement of a Y linear motor.

As it can be seen from FIG. 7 which models the structure inside Y-axis linear motor $LY_1$, one of the Y-axis movers, 48A, has a plate shaped housing 196 shown by a dashed-two dotted line in the drawing, a plurality of first armature coils 190 that have a narrow rectangular shape extending in the X-axis direction placed at a predetermined spacing along the Y-axis direction within housing 196, and a second armature coil 195 that has a narrow rectangular shape extending in the Y-axis direction placed on the +X side of the plurality of first armature coils 190. The other Y-axis mover, 48B, is configured similar to Y-axis mover 48A although it is symmetric to Y-axis mover 48A with respect to the Y-axis. As is shown in FIG. 2, these Y-axis movers 48A and 48B are inserted into the inner space of Y-axis stators 86 and 87, respectively.

As is shown in FIG. 2, Y-axis stators 86 and 87 are each equipped with a stator 88A and permanent magnets 90 and 95, and are supported by levitation with respect to the upper surface of protruded sections BSa and BSb via a predetermined clearance by static gas bearings (not shown) such as, for example, air bearings, arranged on the lower surface of Y-axis stators 86 and 87. Further, the movement of Y-axis stators 86 and 87 in the X-axis direction and in the θx, θy, and θz directions with respect to protruded sections BSa and BSb is limited (refer to the double pointing arrow f in FIG. 6) by the static gas bearings (not shown) such as, for example, the air bearings. Further, although it is omitted in FIG. 2, Y-axis trim motors 92A and 92B are arranged that drive Y-axis stators 86 and 87 in the Y-axis direction, respectively (refer to FIG. 8 and to the double pointing arrow c in FIG. 6).

The other Y-axis stator, 87, is configured similar to Y-axis stator 86 although it is symmetric to Y-axis stator 86 with respect to the Y-axis.

Because Y-axis linear motors $LY_1$ and $LY_2$ are configured in the manner described above, by supplying current to each of the first armature coils 190, Lorentz forces that drive Y-axis movers 48A and 48B in the Y-axis direction are generated due to the electromagnetic interaction between the current and the alternating field described above. Further, by supplying current to the second armature coil 195, Lorentz forces that drive Y-axis movers 48A and 48B in the X-axis direction are generated due to the electromagnetic interaction between the current and the magnetic field described above formed by the second permanent magnet group 95. Accordingly, in the embodiment, by Y-axis linear motors $LY_1$ and $LY_2$, stator unit MY can be driven in the Y-axis direction as well as be driven finely in the X-axis direction, and also by making the drive force in the Y-axis direction generated in Y-axis linear motors $LY_1$ and $LY_2$ slightly different, stator unit MY (or as a consequence, wafer stage WST) can be driven in a rotational direction around the Z-axis (the θz direction) (refer to the double pointing arrow d in FIG. 6).

As is obvious from the description above, in the first embodiment, Y-axis voice coil motor VY, X-axis linear motors $LX_1$ and $LX_2$, Y-axis linear motors $LY_1$ and $LY_2$, Z-axis voice coil motors $VZ_1$ to $VZ_4$, and Y-trim motors 92A and 92B make up a wafer stage drive section 27 that drives wafer stage WST (refer to FIG. 8). Bearings such as the motors, the air bearings and the like that configure wafer stage unit 12 including wafer stage drive section 27 operate under the control of main controller 20 (refer to FIG. 8).

Referring back to FIG. 1, positional information on wafer stage WST within the XY plane is detected at all times by a wafer laser interferometer (hereinafter referred to as 'wafer interferometer') 18 via a movable mirror 17 fixed on the upper section of wafer stage WST (or to be more precise, the upper surface of wafer table WTB), at a resolution, for example, around 0.5 to 1 nm. Wafer interferometer 18 is fixed to barrel platform 38 in a suspended state, and measures the positional information of the reflection surface of movable mirror 17 whose reference is a reflection surface of a fixed mirror 57 fixed to the side surface of barrel 40 that makes up projection unit PU, as the positional information of wafer stage WST.

On wafer table WTB, as is shown in FIG. 3A, a Y movable mirror 17Y that has a reflection surface orthogonal to the scanning direction, which is the Y-axis direction, and an X movable mirror 17X that has a reflection surface orthogonal to the non-scanning direction, which is the X-axis direction, are actually provided, and corresponding to these movable mirrors, laser interferometers and fixed mirrors are also arranged for position measurement in the X-axis direction and position measurement in the Y-axis direction; however, such details are representatively shown as movable mirror 17, wafer interferometer 18, and fixed mirror 57 in FIG. 1. And, for example, the edge surface of wafer table WTB can be mirror polished so as to form a reflection surface (corresponding to the reflection surfaces of movable mirrors 17X and 17Y). Further, the laser interferometer for position measurement in the X-axis direction and the laser interferometer for position measurement in the Y-axis direction are both multi-axis interferometers that have a plurality of measurement axes, and with these interferometers, other than the X and Y positions of wafer table WTB, rotation (yawing (rotation in the θz direction), pitching (rotation in the θx direction), and rolling (rotation in the θy direction) can also be measured. Accordingly, in the description below, wafer interferometer 18 is to measure the position of wafer table WTB in directions of five degrees of freedom, in the X, Y, θz, θy, and θx directions.

Positional information (or velocity information) on wafer stage WST is sent to main controller 20, and based on the positional information (or velocity information) on wafer stage WST, main controller 20 controls the position of wafer stage WST within the XY plane via wafer stage drive section 27.

Next, a configuration of the supply system of pressurized gas to wafer stage WST, the vacuum system, power usage supply unit 155 and the like will be described in detail, referring to FIG. 5 and to FIGS. 9 to 12B.

As is shown in FIG. 5, the +Y end of power usage supply unit 155 is fixed to the surface of tube carrier TC on the −Y side, and the −Y end is fixed to the surface of wafer stage main body 28 on the +Y side.

Inside tube carrier TC, a gas supply pipe line and a discharge pipe line are formed (not shown). One end of both the gas supply pipe line and the discharge pipe line connect to one end of gas supply pipe 203 and discharge pipe 204, respectively, via connecter CN. The other end of both gas supply pipe 203 and discharge pipe 204 connect to a gas supply unit 201 and a vacuum suction unit 202 (refer to FIG. 8) arranged outside of wafer stage unit 12.

The other end of both the gas supply pipe line and the discharge pipe line connect to one end of a supply pipe 241b and a vacuum pipe 241a via a connecter (not shown). The other end of both supply pipe 241b and vacuum pipe 241a connect to power usage supply unit 155, respectively.

Power usage supply unit 155 supplies a fluid (pressurized gas) supplied from gas supply unit 201 via gas supply pipe 203, tube carrier TC, and supply pipe 241b to wafer stage WST via a supply pipe 270A, and also supplies a negative pressure supplied from vacuum suction unit 202 via discharge pipe 204, tube carrier TC, and vacuum pipe 241a to wafer stage WST via a vacuum pipe 270B.

In the embodiment, tube carrier TC relays the supply of pressurized gas from gas supply unit 201 to wafer stage WST, and also relays the supply of negative pressure generated in vacuum suction unit 202 to wafer stage WST.

As is obvious from the description so far, in the embodiment, tubes such as the supply pipe and the vacuum pipe connect to tube carrier TC, however, to wafer stage WST, no piping connects from the outside (excluding piping that is integrally fixed to wafer stage WST, such as supply pipe 270A and vacuum pipe 270B). That is, wafer stage WST in the embodiment is a tubeless stage.

Figure 9:
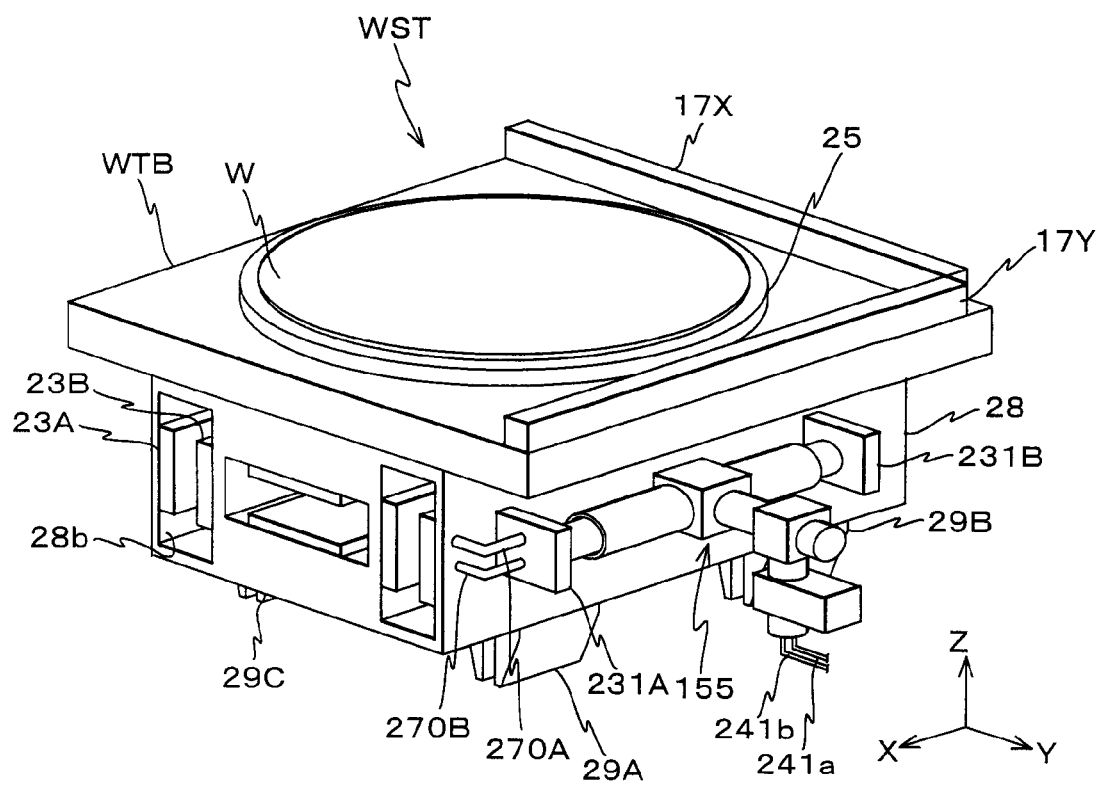
FIG. 9 is a perspective view that shows a state of a power usage supply unit related to the first embodiment attached to the wafer stage.

FIG. 9 shows a state where power usage supply unit 155 is attached to a surface on the +Y side of wafer stage main body 28 that constitutes wafer stage WST. As is shown in FIG. 9, power usage supply unit 155 is composed of a combination of a plurality of cylinder solid members and a plurality of rectangular solid shaped members.

Figure 10:
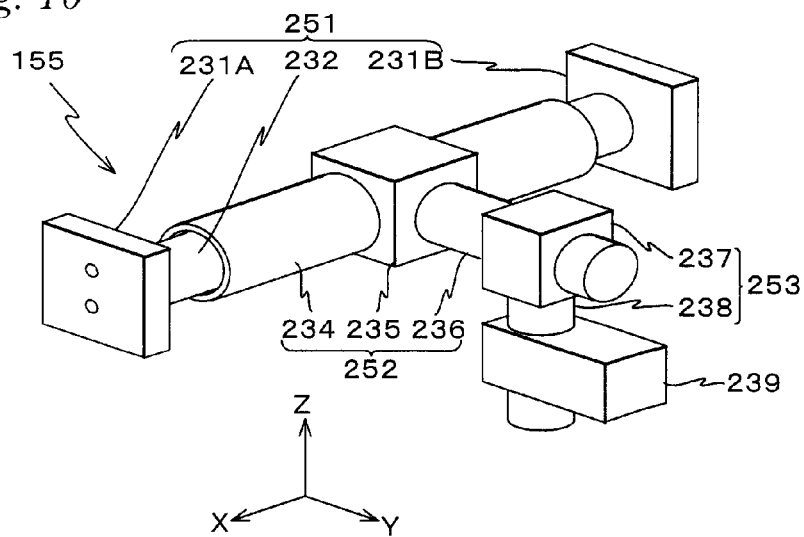
FIG. 10 is a perspective view that shows the power usage supply unit related to the first embodiment.
Figure 11:
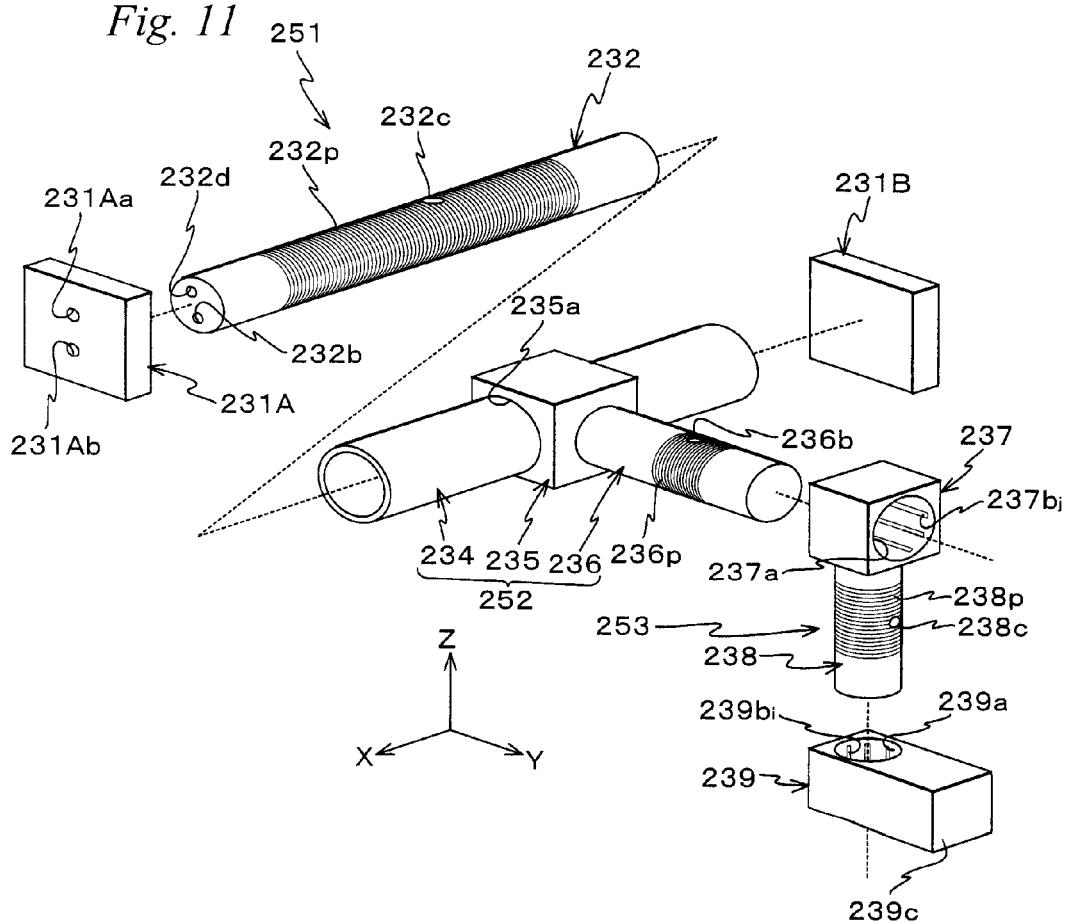
FIG. 11 is an exploded perspective view that shows the power usage supply unit related to the first embodiment.

More specifically, as is shown in FIG. 10, which is an enlarged view of power usage supply unit 155 taken out, and in FIG. 11, which is an exploded perspective view of power usage supply unit 155, power usage supply unit 155 is equipped with a first unit 251, consisting of a pair of plate shaped fixed members 231A and 231B fixed to the edge surface of wafer stage main body 28 on the +Y side and an X-axis solid cylindrical member 232 serving as a first axis section whose longitudinal direction is in the X-axis direction and has fixed members 231A and 231B fixed to both edge surfaces in the longitudinal direction, and a second unit 252 including a hollow cylindrical member 234 attached on the outer circumference of X-axis solid cylindrical member 232, a third unit 253 sequentially connected to the second unit 252, and a Z support member 239. Therefore, X-axis solid cylindrical member 232 serving as the first axis section is also a moving section that moves according to the movement of wafer stage WST in an X direction.

Figure 12A:
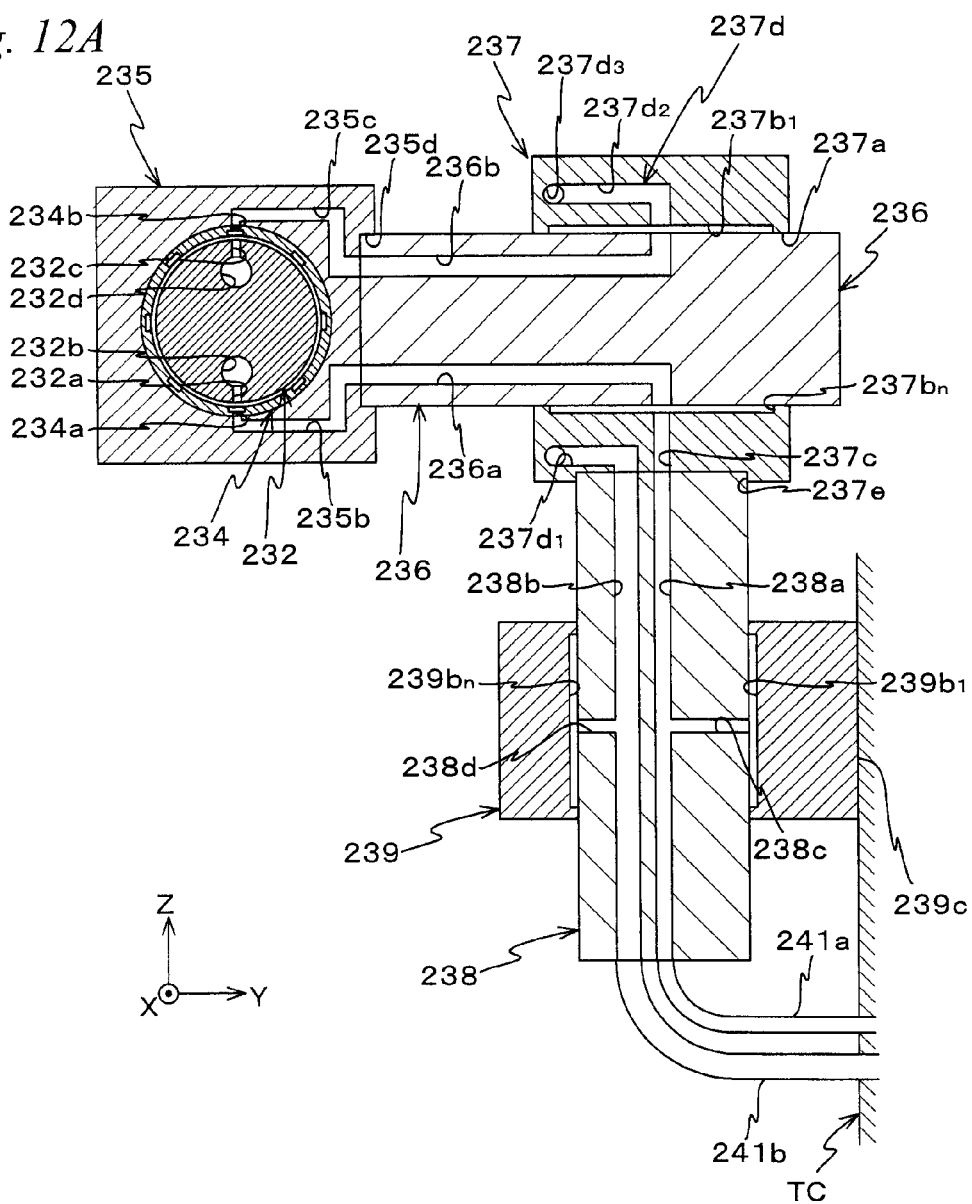
FIG. 12A is a YZ sectional view of the power usage supply unit related to the first embodiment.

As is shown in FIG. 11, on the surface of X-axis solid cylindrical member 232 that constitutes the first unit 251, a plurality of surface throttle grooves 232p of a predetermined depth (ex. a depth of around 10 μm) is formed along the longitudinal direction (the X-axis direction) at a predetermined spacing. Further, on the edge surface of X-axis solid cylindrical member 232 on the +X side, two circular holes 232d and 232b are formed that reach the area close to the center in the X-axis direction. As it is shown in FIG. 12A, which is a YZ sectional view of power usage supply unit 155, and FIG. 12B, which is an enlarged view of X-axis solid cylindrical member 232 and hollow cylindrical member 234 in FIG. 12A, one of the circular holes 232d is formed at a position slightly shifted to the +Z side from the center of the cross-sectional surface and the other circular hole 232b is formed at a position slightly shifted to the −Z side from the center of the cross-sectional surface.

Figure 12B:
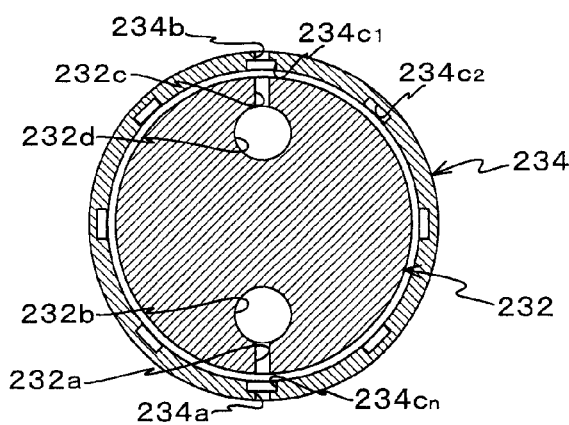
FIG. 12B is an enlarged sectional view of a first solid cylindrical member and a hollow cylindrical member.

Further, as is shown in FIG. 11, on the upper surface of X-axis solid cylindrical member 232 at the center in the X-axis direction, a circular hole 232c is formed. As is shown in FIG. 12B, circular hole 232c communicates with circular hole 232d. Circular hole 232d and circular hole 232c form a pipe line that resembles the shape of the letter L, and this pipe line is a first fluid supply pipe line.

Further, as is shown in FIG. 12B, on the lower surface of X-axis solid cylindrical member 232 at the center in the X-axis direction, a circular hole 232a that communicates with circular hole 232b is formed. Circular hole 232b and circular hole 232a form a pipe line that resembles the shape of the letter L, and this pipe line is a first vacuum pipe line. In FIG. 11, surface throttle grooves 232p were arranged in the circular hole 232c section, however, as it is obvious from FIG. 12, on the opposite side of circular hole 232c, circular hole 232b that is the first vacuum pipe line is formed. Therefore, it is preferable to arrange surface throttle grooves 232p avoiding circular hole 232b (and circular hole 232c) and the vicinity of the holes.

As is shown in FIG. 11, in one of the fixed members 231A, flow passages 231Aa and 231Ab are formed penetrating fixed member 231A, each made of a circular hole whose longitudinal direction is the X-axis direction so that the holes communicate with circular hole 232d and circular hole 232b. As is shown in FIG. 9, flow passage 231Aa connects to one end of supply pipe 270A via a connecter (not shown) and flow passage 231Ab connects to one end of vacuum pipe 270B via a connecter (not shown). The other end of supply pipe 270A and vacuum pipe 270B each connect to a part of wafer stage main body 28. The other fixed member 231B differs from fixed member 231A, and is configured of a plate shaped member that does not have any passages formed.

As is shown in FIG. 10, the second unit 252 is configured including hollow cylindrical member 234, an attachment member 235 fixed on the outside of hollow cylindrical member 234 at the center in the longitudinal direction, and a Y-axis solid cylindrical member 236 serving as a second axis section that has a part of the tip on one end (the edge surface of on the −Y side) embedded in the edge surface of attachment member 235 on the +Y side and extends in the Y-axis direction. Y-axis solid cylindrical member 236 serving as the second axis section also serves as a moving section that moves according to the movement of wafer stage WST in the Y-axis direction.

As is shown in FIG. 10, hollow cylindrical member 234 has a diameter slightly larger than the diameter of X-axis solid cylindrical member 232, and is in a state where X-axis solid cylindrical member 232 is inserted inside. In this case, as is shown in FIG. 12B, a predetermined gap is formed entirely between the inner circumferential surface of hollow cylindrical member 234 and the inner circumferential surface of X-axis solid cylindrical member 232. Therefore, X-axis solid cylindrical member 232 is in a state where it can relatively move in the X-axis direction and the rotational direction around the X-axis with respect to hollow cylindrical member 234. That is, hollow cylindrical member 234 configures a first support section that movably supports X-axis solid cylindrical member 232 in the X-axis direction and around the X-axis.

As is shown in FIG. 12B, in hollow cylindrical member 234, on the inner circumferential surface in the X-axis direction, a plurality of depressed grooves (e.g. eight) $234c_1$, $234c_2, \ldots, 234c_n$ are formed at a predetermined angular spacing.

As is shown in FIG. 12B, one of the depressed grooves $234c_1$ is positioned so as to face circular hole $232c$ of X-axis solid cylindrical member 232, and in a part of the bottom surface of depressed groove $234c_1$, a circular hole $234b$ that penetrates and reaches the outer surface of hollow cylindrical member 234 is formed. Further, at a position on the inner surface of hollow cylindrical member 234 facing depressed groove $234c_1$, depressed groove $234c_n$ is positioned so as to face circular hole $232a$ previously described, and in a part of the bottom surface of depressed groove $234c_n$, a circular hole $234a$ that penetrates and reaches the outer surface of hollow cylindrical member 234 is formed. Depressed grooves $234c_1$, $234c_2, \ldots, 234c_n$ can also be arranged not on the inner circumferential surface of hollow cylindrical member 234 but on the outer periphery surface of X-axis solid cylindrical member 232. Furthermore, these depressed grooves $234c_1$, $234c_2, \ldots, 234c_n$ do not necessarily have to be arranged along the X-axis direction, and a plurality of grooves can be arranged at a predetermined spacing in the X-axis direction on the outer periphery surface of X-axis solid cylindrical member 232.

As is shown in FIG. 11, attachment member 235 has an outer shape which is substantially a cube, and a through hole $235a$ of a circular shape is formed penetrating the cube from the edge surface on the +X side to the edge surface on the −X side. Inside through hole $235a$, hollow cylindrical member 234 is inserted, and on the outside of hollow cylindrical member 234 at the center in the X-axis direction, attachment member 235 is attached in a state where there is no space between the members.

Inside attachment member 235, pipe lines $235c$ and $235b$ are formed in a state where one end of each of the pipe lines communicates with circular hole $234b$ and circular hole $234a$ formed in hollow cylindrical member 234, respectively, as is shown in FIG. 12A. In the description below, for the sake of convenience, circular hole $234b$ and pipe line $235c$ will be referred to together as a second fluid supply pipe line, and circular hole $234a$ and pipe line $235b$ will be referred to together as a second vacuum pipe line.

As is shown in FIG. 12A, on the edge surface of attachment member 235 on the +Y side, a shallow circular depressed section $235d$ is formed, and a Y-axis solid cylindrical member 236 orthogonal to X-axis solid cylindrical member 232 is fixed to attachment member 235 in a state where the tip section of Y-axis solid cylindrical member 236 on the −Y side is fitted in depressed section $235d$. Y-axis solid cylindrical member 236 does not necessarily have to be orthogonal to X-axis solid cylindrical member 232 as long as it intersects X-axis solid cylindrical member 232.

As is shown in FIG. 12A, inside Y-axis solid cylindrical member 236, a third fluid supply pipe line $236b$ and a third vacuum pipe line $236a$ are formed whose sectional shapes resemble the letter L and have one end that communicates with the other end of pipe lines $235c$ and $235b$ formed in attachment member 235 previously described, respectively. Further, on the surface of Y-axis solid cylindrical member 236, a plurality of surface throttle grooves $236p$ of a predetermined depth (ex. a depth of around 10 μm) is formed along the longitudinal direction (the Y-axis direction) at a predetermined spacing, as is shown in FIG. 11. It is also preferable to arrange the plurality of surface throttle grooves $236p$ formed on the surface of Y-axis solid cylindrical member 236, while avoiding the circular hole $236a$ (and circular hole $236b$) section on the surface of Y-axis solid cylindrical member 236.

As is shown in FIG. 10, the third unit 253 is configured including a Y support member 237 that has a substantially cubic outer shape and is arranged on the outer circumferential side in the vicinity of the edge section on the +Y side of Y-axis solid cylindrical member 236, and a Z-axis solid cylindrical member 238 serving as a third axis section fixed to the lower surface (the surface on the −Z side) of Y support member 237 orthogonal to X-axis solid cylindrical member 232 and to Y-axis solid cylindrical member 236. Z-axis solid cylindrical member 238 serving as the third axis section is also a moving section that moves according to the movement of wafer stage WST in a Z direction. Z-axis solid cylindrical member 238 does not necessarily have to be attached to Y support member 237 orthogonal to X-axis solid cylindrical member 232 and Y-axis solid cylindrical member 236.

In Y support member 237, a circular through hole $237a$ that penetrates Y support member 237 from the edge surface on the +Y side to the edge surface on the −Y side is formed (refer to FIG. 11), and Y-axis solid cylindrical member 236 is inserted into through hole $237a$ via a predetermined clearance around the entire circumference of Y-axis solid cylindrical member 236. Therefore, Y-axis solid cylindrical member 236 is in a relatively movable state in the Y-axis direction and the rotational direction around the Y-axis with respect to Y support member 237. That is, Y support member 237 constitutes a second support section that movably supports Y-axis solid cylindrical member 236 in the Y-axis direction and around the Y-axis.

As is shown in FIG. 12A, on the inner circumferential surface of Y support member 237, a plurality of depressed grooves $237b_j$ (j=1 to n, for example, n is 8,) that extend in the Y-axis direction is formed at a predetermined angular spacing as in depressed grooves $234c_1, 234c_2, \ldots, 234c_n$ of hollow cylindrical member 234 described earlier (however, in FIG. 12A, only two depressed grooves $237b_1$ and $237b_n$ are shown, refer to FIG. 11). And, in Y support member 237, a fourth vacuum pipe line $237c$ is formed, in a state where the pipe line communicates with depressed groove $237b_n$ located at a position closest to the −Z side. Further, in Y support member 237, a fluid supply pipe line $237d_2$ is formed, in a state where the pipe line communicates with depressed groove $237b_1$ located at a position closest to the +Z side. Fluid supply pipe line $237d_2$ communicates with a fluid supply pipe line $237d_1$ formed on the lower half section of support member 237 via a fluid supply pipe line $237d_3$. In this case, fluid supply pipe line $237d_3$ is a half arc shaped pipe line formed inside Y support member 237 in half of the depth of the page surface of FIG. 12A. In the description below, fluid supply pipe lines $237d_1$, $237d_2$, and $237d_3$ will be referred to together as "a fourth liquid fluid supply pipe line $237d$". The plurality of depressed grooves $237b_j$ can be formed not only on the inner circumferential surface of Y support member 237 but also on the outer circumference of Y-axis solid cylindrical member 236, and the grooves do not necessarily have to be arranged along the Y-axis direction.

As is shown in FIG. 11, in Z-axis solid cylindrical member 238, surface throttle grooves $238p$ of a predetermined depth (ex. a depth of around 10 μm) is formed in the center along the longitudinal direction (the Z-axis direction) at a predetermined spacing. Further, Z-axis solid cylindrical member 238 is fixed in a state where the upper end is fitted inside a shallow circular depressed section $237e$ formed in the lower end surface of Y support member 237. As is shown in FIG. 12A, inside Z-axis solid cylindrical member 238, a fifth vacuum pipe line $238a$ in the Z-axis direction is formed in a penetrated state, in a state communicating with the fourth vacuum pipe line $237c$ formed in Y support member 237 previously described. Further, inside Z-axis solid cylindrical member 238, on the −Y side of the fifth vacuum pipe line 238a, a fifth fluid supply pipe line 238b in the Z-axis direction is formed, in a state communicating with the fourth fluid supply pipe line 237d. The end of the fifth vacuum pipe line 238a on the −Z side connects to one end of vacuum pipe 241a described earlier via a connecter (not shown), and the end of the fifth fluid supply pipe line 238b connects to one end of supply pipe 241b described earlier via a connecter (not shown).

In Z-axis solid cylindrical member 238, a branched pipe line 238c is formed that branches from the fifth vacuum pipe line 238a from the center in the Z-axis direction toward the +Y direction, and the tip of branched pipe line 238c opens toward the outside of the outer circumferential surface of Z-axis solid cylindrical member 238 (refer to FIG. 11). In Z-axis solid cylindrical member 238, a branched pipe line 238d is formed that branches from the fifth fluid supply pipe line 238b from the center in the Z-axis direction toward the −Y direction, and the tip of branched pipe line 238d opens toward the outside of the outer circumferential surface of Z-axis solid cylindrical member 238. It is preferable to form surface throttle grooves 238p formed on the surface of Z-axis solid cylindrical member 238, while avoiding branched pipe line 238c and its neighboring area.

As is shown in FIGS. 10, 12 and the like, Z support member 239 has an outer shape which is a rough rectangular solid shape, and an edge surface 239c of Z support member 239 on the +Y side is fixed to the edge surface of tube carrier TC on the −Y side (refer to FIG. 12A).

In Z support member 239, a circular through hole 239a is formed from the edge surface on the +Z side to the edge surface on the −Z side (refer to FIG. 11), and Z-axis solid cylindrical member 238 is inserted into through hole 239a via a predetermined clearance around the entire circumference of Z-axis solid cylindrical member 238. Therefore, Z-axis solid cylindrical member 238 is in a relatively movable state in the Z-axis direction and the rotational direction around the Z-axis with respect to Z support member 239. That is, Z support member 239 constitutes a third support section that movably supports Z-axis solid cylindrical member 238 in the Z-axis direction and around the Z-axis.

As is shown in FIG. 12A, on the inner circumferential surface of Z support member 239, a plurality of depressed grooves $239b_i$ (i=1 to n, for example, n is 8,) that extend in the Z-axis direction is formed at a predetermined angular spacing as in depressed grooves $234c_1, 234c_2, \ldots, 234c_n$ of hollow cylindrical member 234 described earlier (however, in FIG. 12A, only two depressed grooves $239b_1$ and $239b_n$ are shown, refer to FIG. 11). The plurality of depressed grooves $239b_j$ can be formed not only on the inner circumferential surface of Z support member 239 but also on the outer circumference of Z-axis solid cylindrical member 238, and the grooves do not necessarily have to be arranged along the Z-axis direction.

Further, as the material for X-axis solid cylindrical member 232, hollow cylindrical member 234, Y-axis solid cylindrical member 236, and Z-axis solid cylindrical member 238, ceramic or aluminum can be used.

Next, the operation of power usage supply unit 155 configured in the manner described above will be briefly described.

As is described earlier, the fluid (pressurized gas) supplied to tube carrier TC from gas supply unit 201 via gas supply pipe 203 is supplied to the fifth fluid supply pipe line 238b within Z-axis solid cylindrical member 238 of power usage supply unit 155. Next, a part of the pressurized gas supplied inside the fifth fluid supply pipe line 238b is discharged outside the outer circumferential surface of Z-axis solid cylindrical member 238 via branched pipe line 238d, and most of the remaining gas passes through the fifth fluid supply pipe line 238b and then moves toward the fourth fluid supply pipe line 237d formed in Y support member 237.

The pressurized gas discharged outside the outer circumferential surface of Z-axis solid cylindrical member 238 spreads swiftly entirely in the Z-axis direction in the gap between Z-axis solid cylindrical member 238 and Z support member 239 via grooves $239b_1$ to $239b_n$ formed on the inner circumferential surface of Z support member 239, and also enters surface throttle grooves 238p on the outer circumferential surface of Z-axis solid cylindrical member 238 and spreads in the entire circumferential direction in the gap between Z-axis solid cylindrical member 238 and Z support member 239. Accordingly, due to the static pressure of the pressurized gas (or the pressure within the gap) that has entered surface throttle grooves 238p, Z-axis solid cylindrical member 238 is supported in a non-contact manner with respect to Z support member 239. That is, in the manner described above, a type of static gas bearing is configured in the entire area of surface throttle grooves 238p. In this case, because surface throttle grooves 238p of Z-axis solid cylindrical member 238 is formed on the entire circumference of the outer surface of Z-axis solid cylindrical member 238, the static pressure of the pressurized gas is substantially equal along the entire circumference, therefore the same clearance is made in the entire circumferential direction of Z-axis solid cylindrical member 238. As a consequence, Z-axis solid cylindrical member 238 is in a state where movement in the Z-axis direction and the rotational direction around the Z-axis of Z-axis solid cylindrical member 238 with respect to Z support member 239 is permissible.

Meanwhile, the pressurized air that moves toward the fourth fluid supply pipe line 237d sequentially passes through fluid supply pipe lines $237d_1, 237d_3,$ and $237d_2$ and then a part of the pressurized gas is discharged from an opening end of fluid supply pipe line $237d_2$ formed in the bottom surface inside depressed groove $237b_1$ into a slight gap in between Y-axis solid cylindrical member 236 and Y support member 237, and most of the remaining gas moves toward the second fluid supply pipe line (235c and 234b) formed inside attachment member 235 via the third fluid supply pipe line 236b formed within Y-axis solid cylindrical member 236.

The pressurized gas discharged into the slight gap in between Y-axis solid cylindrical member 236 and Y support member 237 swiftly spreads in the entire Y-axis direction in the gap between Y-axis solid cylindrical member 236 and Y support member 237 via each of the grooves $237b_1$ to $237b_n$ formed in the inner circumferential surface of Y support member 237, and also enters surface throttle grooves 236p on the outer circumferential surface of Y-axis solid cylindrical member 236 and spreads in the entire circumferential direction in the gap between Y-axis solid cylindrical member 236 and Y support member 237. Accordingly, due to the static pressure of the pressurized gas (or the pressure within the gap) that has entered surface throttle grooves 236p, Y-axis solid cylindrical member 236 is supported in a non-contact manner with respect to Y support member 237. That is, in the manner described above, a type of static gas bearing is configured in the entire area of surface throttle grooves 236p. In this case, because surface throttle grooves 236p of Y-axis solid cylindrical member 236 is formed on the entire circumference of the outer surface of Y-axis solid cylindrical member 236, the static pressure of the pressurized gas is substantially equal along the entire circumference, therefore the same clearance is made in the entire circumferential direction of Y-axis solid cylindrical member 236. As a consequence, Y-axis solid cylindrical member 236 is in a state where movement in the Y-axis direction and the rotational direction around the Y-axis of Y-axis solid cylindrical member 236 with respect to Y support member 237 is permissible.

Meanwhile, of the second fluid supply pipe line (235c and 234b), the pressurized air supplied to the second fluid supply pipe line is partially discharged from circular hole 234b formed in hollow cylindrical member 234 into a slight gap in between hollow cylindrical member 234 and X-axis solid cylindrical member 232 via depressed groove $234c_1$, and the remaining gas is supplied to the first fluid supply pipe line (232c and 232d) formed in X-axis solid cylindrical member 232.

The pressurized gas discharged into the slight gap in between hollow cylindrical member 234 and X-axis solid cylindrical member 232 swiftly spreads in the entire X-axis direction in the gap between hollow cylindrical member 234 and X-axis solid cylindrical member 232 via each of the grooves $234c_1$ to $234c_n$ formed in the inner circumferential surface of hollow cylindrical member 234, and also enters surface throttle grooves 232p on the outer circumferential surface of X-axis solid cylindrical member 232 and spreads in the entire circumferential direction in the gap between X-axis solid cylindrical member 232 and hollow cylindrical member 234. Accordingly, due to the static pressure of the pressurized gas (or the pressure within the gap) that has entered surface throttle grooves 232p, X-axis solid cylindrical member 232 is supported in a non-contact manner with respect to hollow cylindrical member 234. That is, in the manner described above, a type of static gas bearing is configured in the entire area of surface throttle grooves 232p. In this case, because surface throttle grooves 232p of X-axis solid cylindrical member 232 is formed on the entire circumference of the outer surface of X-axis solid cylindrical member 232, the static pressure of the pressurized gas is substantially equal along the entire circumference, therefore the same clearance is made in the entire circumferential direction of X-axis solid cylindrical member 232. As a consequence, X-axis solid cylindrical member 232 is in a state where movement in the X-axis direction and the rotational direction around the X-axis of X-axis solid cylindrical member 232 with respect to hollow cylindrical member 234 is permissible.

Meanwhile, the pressurized gas supplied to the first fluid supply pipe line (232c and 232d) is sent inside wafer stage main body 28 sequentially passing through the first fluid supply pipe line, flow passage 231Aa formed in fixed member 231A (refer to FIG. 11), and supply pipe 270A (refer to FIG. 9). The pressurized gas sent inside wafer stage main body 28 passes through a gas supply pipe line (not shown) inside wafer stage main body 28 and is supplied and used in various mechanisms of wafer stage WST. In the embodiment, for example, the pressurized gas sent inside wafer stage main body 28 is supplied to self-weight canceller 101 described earlier, and as well as to an elevating mechanism (not shown) that elevates vertical movement pins (center-ups) (not shown) arranged on wafer holder 25 for elevating wafer W.

Meanwhile, when vacuum suction by vacuum suction unit 202 begins, the negative pressure generated in vacuum suction unit 202 is supplied to a vacuum pipe line inside wafer stage main body 28 via discharge pipe 204, tube carrier TC, vacuum pipe 241a, power usage supply unit 155, and vacuum pipe 270B.

During the suction operation, a gas flow that flows toward the second vacuum pipe line (234a and 235b) sequentially from the wafer stage main body 28 side via vacuum pipe 270B, flow passage 231Ab formed in fixed member 231A, the first vacuum pipe line (232b and 232a) formed inside X-axis axis solid cylindrical member 232, and depressed groove $234c_n$ formed in hollow cylindrical member 234 is generated. By the negative pressure caused by the gas flow, the pressurized gas supplied to the gap between X-axis axis solid cylindrical member 232 and hollow cylindrical member 234 is suctioned, and by the suction force, the pressurized air swiftly spreads to the entire circumference of X-axis solid cylindrical member 232 and a constant amount of pressurized gas is also maintained within the gap.

Further, inside Y-axis solid cylindrical member 236 and Y support member 237, a gas flow that flows toward the fourth vacuum pipe line 237c from the third vacuum pipe line 236a formed in Y-axis solid cylindrical member 236 via depressed groove $237b_n$ formed in Y support member 237 is generated. By the negative pressure caused by the gas flow, the pressurized gas supplied to the gap between Y-axis axis solid cylindrical member 236 and Y support member 237 is suctioned, and the pressurized air swiftly spreads to the entire circumference of Y-axis solid cylindrical member 236 and a constant amount of pressurized gas is also maintained within the gap.

Further, inside the fifth vacuum pipe line 238a formed in Z-axis solid cylindrical member 238, a gas flow that flows toward vacuum pipe 241a is generated. By the negative pressure caused by the gas flow, the pressurized gas supplied to the gap between Z-axis axis solid cylindrical member 238 and Z support member 239 is suctioned via branched pipe line 238c, and the pressurized air swiftly spreads to the entire circumference of Z-axis solid cylindrical member 238 and a constant amount of pressurized gas is also maintained within the gap.

Further, inside vacuum pipe 241a, tube carrier TC, and discharge pipe 204 a gas flow that flows toward vacuum suction unit 202 is generated.

In the embodiment, by the gas flow described above due to the negative pressure generated in vacuum suction unit 202, operations such as for example, vacuum suction of wafer W by wafer holder 25, vacuum suction of wafer table WTB by wafer stage main body 28, vacuum suction of the wafer by the tip of the vertical movement pins (center-ups) and the like are performed inside wafer stage WST.

Further, as is stated in the pamphlet of International Publication WO2004/053953, in an immersion exposure apparatus that projects a pattern on a wafer in a state where a liquid (e.g. pure water) is supplied in the space between projection optical system PL and wafer W, when there is a risk of the liquid moving to the back surface of wafer W it is disclosed that the liquid is to be suctioned. Therefore, for example, a new suction pipe can be arranged in addition to discharge pipe 270B, and the liquid that may move to the back surface of wafer holder 25 can be suctioned using the vacuum. In addition, the section with the risk of the liquid moving to the back surface of wafer stage WST can be appropriately suctioned using power usage supply unit 155. In the case disturbance such as vibration occurs due to the suction of the liquid that may affect the exposure accuracy, the suction of the liquid can be performed when exposure operation is not being performed (e.g. during wafer exchange after the completions of the exposure operation). As long as the national laws in designated states (or elected states), on which this international application is applied, permit, the disclosure of the U.S. patent application corresponding to the pamphlet of International Publication WO2004/053953 is incorporated herein by reference.

Power usage supply unit 155 can supply the liquid whose temperature has been adjusted to wafer stage WST. To be more specific, a supply pipe independent from supply pipe 270A can be arranged and the liquid whose temperature has been adjusted can be supplied to permanent magnets 22A, 22B, 23A to 23D, and 29A to 29D arranged in wafer stage main body 28. Accordingly, heat generation of permanent magnets 22A, 22B, 23A to 23D, and 29A to 29D due to eddy current can be reduced. Further, by supplying the liquid whose temperature has been adjusted to wafer holder 25, the temperature of wafer holder 25 can be adjusted.

In case the number of supply pipes and discharge pipes increases, a plurality of power usage supply unit 155 can be arranged. For example, in the case two power usage supply units 155 are arranged, the units can be arranged horizontally symmetrical or vertically symmetrical.

During the exposure operation, main controller 20 drives tube carrier TC via X-axis linear motor RX in the same direction as the stepping direction of wafer stage WST and makes tube carrier TC roughly follow wafer stage WST. In this operation, main controller 20 makes X-axis linear motor RX act a drive force that makes tube carrier TC move at a constant speed. In the embodiment, even if tube carrier TC does not follow wafer stage WST in the X, Y directions with good precision, hollow cylindrical member 234 movably supports X-axis axis solid cylindrical member 232 while Y support member 237 movably supports Y-axis axis solid cylindrical member 236. Therefore, no force is applied to wafer stage WST from power usage supply unit 155. Similarly, in the case wafer stage WST is driven in the Z direction, because Z support member 239 movably supports Z-axis axis solid cylindrical member 238, no force (e.g. tension) is applied to wafer stage WST from power usage supply unit 155.

As is described in detail above, according to wafer stage unit 12 in the embodiment, power usage supply unit 155 that connects to wafer stage WST, which moves on upper surface 71a of stage base 71, and supplies pressurized gas (fluid) or vacuum to wafer stage WST is configured including X-axis axis solid cylindrical member 232 (the first axis section), hollow cylindrical member 234 (the first support section), Y-axis axis solid cylindrical member 236 (the second axis section), Y support member 237 (the second support section), Z-axis axis solid cylindrical member 238 (the third axis section), and Z support member 239 (the third support section), and X-axis axis solid cylindrical member 232 is movably supported in the X-axis direction and around the X-axis by hollow cylindrical member 234, Y-axis axis solid cylindrical member 236 is movably supported in the Y-axis direction and around the Y-axis by Y support member 237, and Z-axis axis solid cylindrical member 238 is movably supported in the Z-axis direction and around the Z-axis by Z support member 239. Accordingly, even if a force in any direction of six degrees of freedom acts on power usage supply unit 155 due to the movement of wafer stage WST, because power usage supply unit 155 absorbs the force by changing its position and attitude according to the force, power usage supply unit 155 does not interfere with the movement of the stage. Accordingly, there is no decrease in position controllability caused by dragging a tube as in the case when tubes are used for the piping when supplying the fluid and the position controllability of wafer stage WST can be favorably secured.

Further, because a first, second, and third static gas bearings are arranged between X-axis axis solid cylindrical member 232 and hollow cylindrical member 234, Y-axis axis solid cylindrical member 236 and Y support member 237, and Z-axis axis solid cylindrical member 238 and Z support member 239, respectively, the space between X-axis axis solid cylindrical member 232 and hollow cylindrical member 234, Y-axis axis solid cylindrical member 236 and Y support member 237, and Z-axis axis solid cylindrical member 238 and Z support member 239 can each be configured in a non-contact manner, which allows power usage supply unit 155 to change its position and attitude without generating a resisting force even if a force in any direction of six degrees of freedom acts on power usage supply unit 155 due to the movement of wafer stage WST. Accordingly, decrease in position controllability due to power usage supply unit 155 can be almost completely prevented.

Further, in the embodiment, because power usage supply unit 155 is arranged in tube carrier TC that moves in a constant speed along the X-axis direction, by making tube carrier roughly follow the movement of wafer stage WST in the X-axis direction, the permissible range of power usage supply unit 155 in the X-axis direction can be designed small, which consequently makes it possible to reduce the size of wafer stage unit 12 and also to reduce the amount of heat generated in the linear motor.

Further, according to exposure apparatus 100 of the embodiment, because wafer stage unit 12 described above is used as the stage unit for moving wafer W serving as a substrate, position controllability of wafer W (wafer stage WST) when performing exposure operation by the step-and-scan method in which the pattern of reticle R is transferred onto a plurality of shot areas on wafer W can be improved, and as a consequence, the pattern of reticle R can be transferred with high precision on wafer W.

In the embodiment above, the case has been described where tube carrier TC performs a constant speed motion, however, tube carrier TC can also be driven by arranging a reflection surface in tube carrier TC, measuring the position of tube carrier TC using an interferometer or an encoder, and making tube carrier TC follow wafer stage WST based on the measurement results.

In the embodiment described above, Y-axis axis solid cylindrical member 236 was attached to Z-axis axis solid cylindrical member 238, however, hollow cylindrical member 234 or X-axis axis solid cylindrical member 232 can also be attached to Z-axis axis solid cylindrical member 238.

Further, in the embodiment described above, X-axis axis solid cylindrical member 232 was configured to be a movement section, however, hollow cylindrical member 234 can also be configured to be a movement section. Similarly, Y-axis axis solid cylindrical member 236 and Z-axis axis solid cylindrical member 238 were configured to be movement sections, however, the members that surround both Y-axis axis solid cylindrical member 236 and Z-axis axis solid cylindrical member 238 can also be configured to be movement sections.

A Second Embodiment

A second embodiment of the present invention is described below, referring to FIGS. 13 to 15. For parts that have the same or similar arrangement as the first embodiment previously described, the same reference numerals will be used, and the description thereabout will be brief, or entirely omitted. In the exposure apparatus of the second embodiment, only a part of the configuration of the wafer stage unit (stage unit) differs, and the configuration of other sections is similar to exposure apparatus 100 of the first embodiment previously described.

Figure 13:
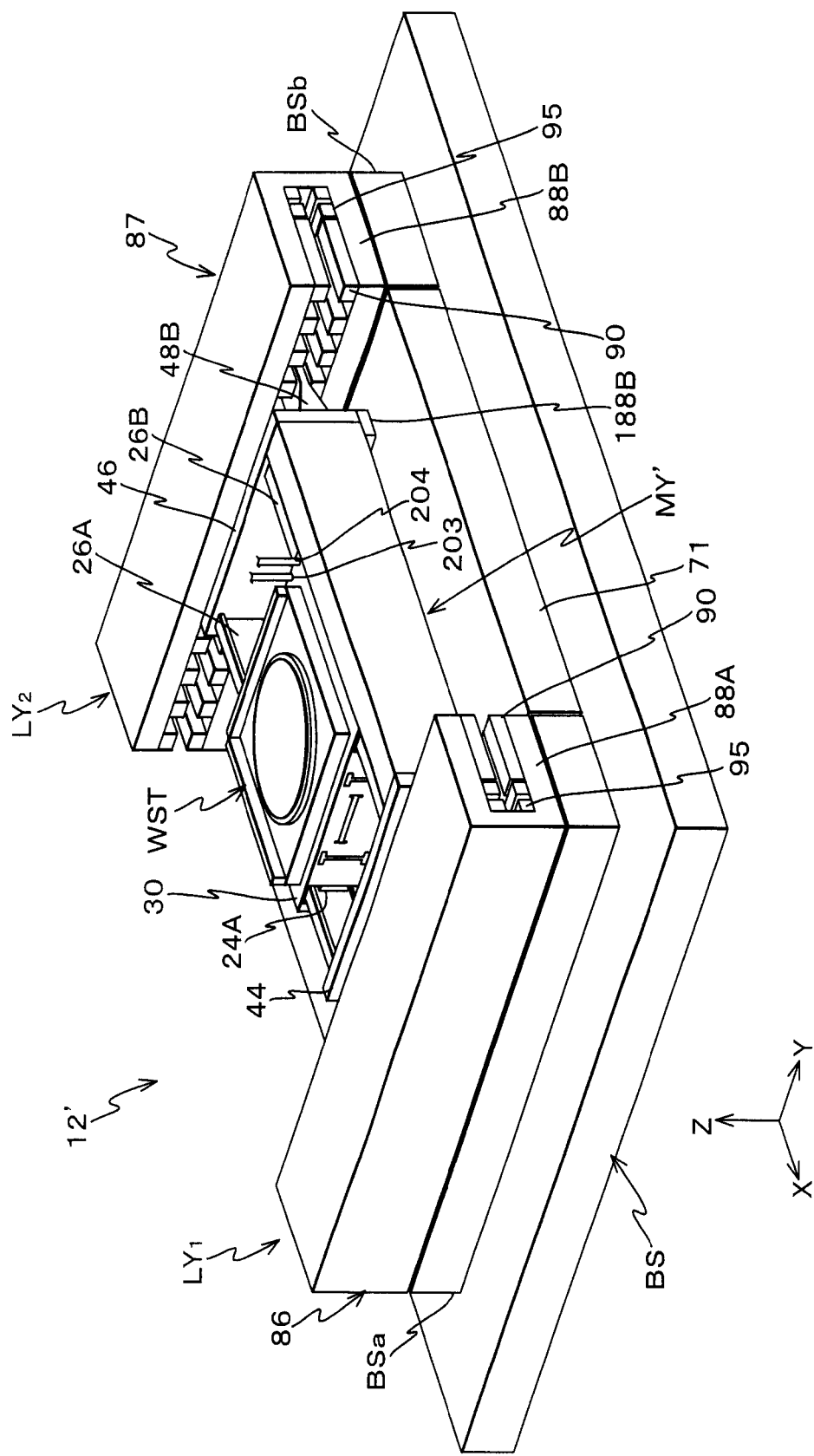
FIG. 13 is a perspective view of a wafer stage unit 12' related to a second embodiment.

FIG. 13 shows a perspective view of a configuration of wafer stage unit 12' related to the second embodiment. When comparing FIGS. 13 and 2, it can be seen that the section driven in the Y-axis direction by Y-axis linear motors $LY_1$ and $LY_2$ of wafer stage unit 12' in the second embodiment differs from wafer stage unit 12 in the first embodiment. More specifically, in wafer stage unit 12', instead of stator unit MY previously described, a moving body unit MY' is arranged, and instead of tube carrier TC attached to stator unit MY, a counter mass 30 in which wafer stage WST is incorporated is arranged. In the description below, from the viewpoint of avoiding repetition, these differences will be mainly described. The basic configuration of wafer stage unit 12' in the embodiment is stated in the description of Japanese Patent Application No. 2004-116043, which is a previous application.

Figure 14A:
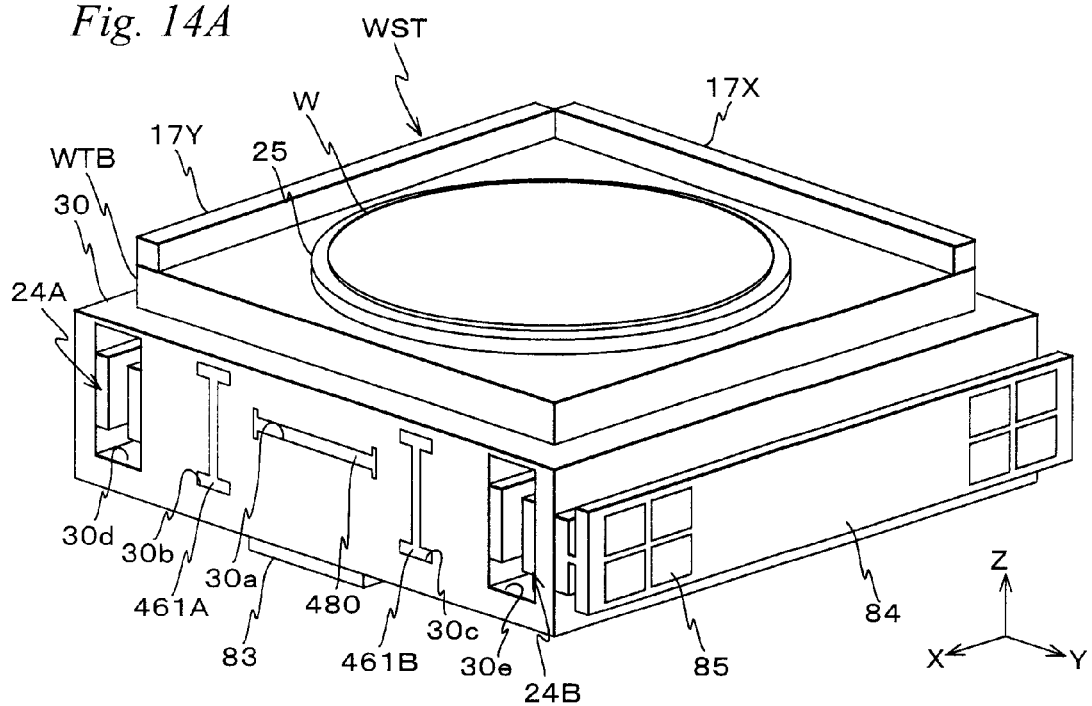
FIG. 14A is a perspective view of a counter mass and a wafer stage attached to the counter mass extracted from wafer stage unit 12' in FIG. 13.

FIG. 14A shows a perspective view of counter mass 30 and wafer stage WST attached to the counter mass extracted from wafer stage unit 12', and FIG. 14 shows a sectional view of FIG. 14A in an X-Z plane. Further, FIG. 15 shows a planar view of wafer stage unit 12' in a state where wafer table WTB is detached from wafer stage WST.

Figure 14B:
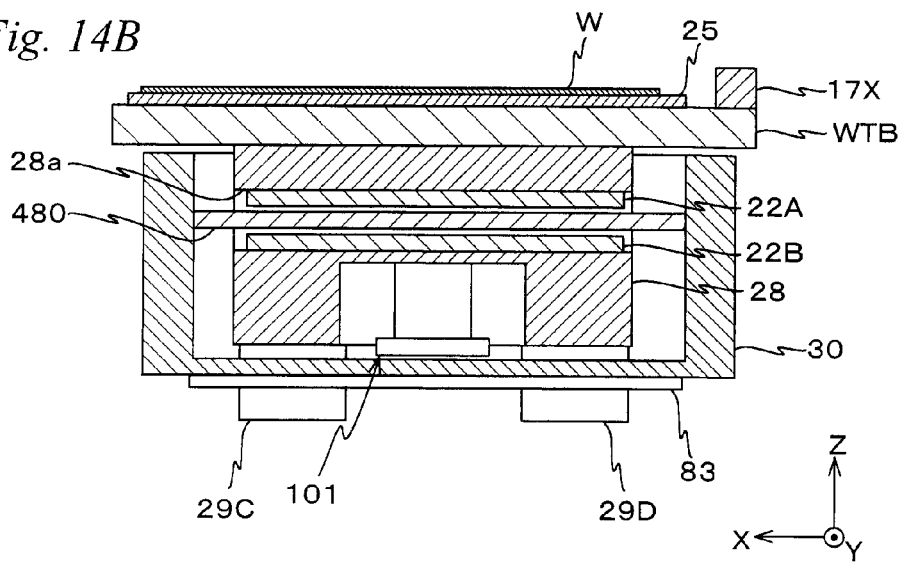
FIG. 14B is an XY sectional view of a component part in FIG. 14A.
Figure 15:
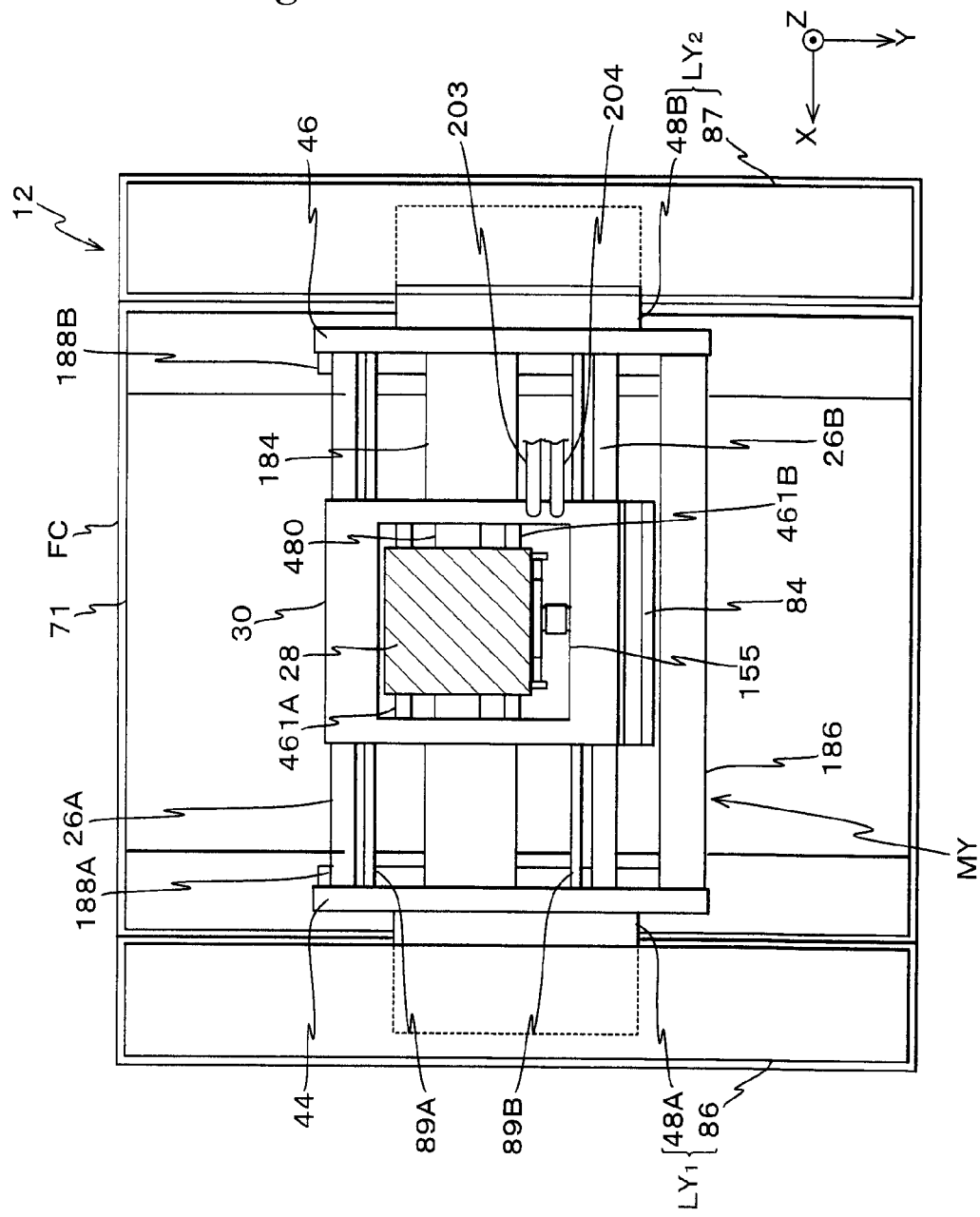
FIG. 15 is a planar view of wafer stage unit 12' in a state where the wafer table is detached.

As is obvious from FIG. 15, counter mass 30 has a rectangular shaped opening formed in the center on the upper surface, and has a shape of a box that has four thick side walls, especially the walls on both sides in the Y-axis direction. Wafer stage WST that can relatively move with respect to counter mass 30 is attached to counter mass 30 in a state where wafer stage main body 28 is housed inside the space in counter mass 30 (refer to FIG. 14B).

In opening 30a formed in the side wall of counter mass 30 on the +X side and an opening facing opening 30a in the side wall on the −Y side, both ends of a Y-axis stator 480 in the longitudinal direction, consisting of an armature unit whose configuration is similar to Y-axis stator 80 previously described, are inserted and fixed. Similar to Y-axis stator 80 previously described, Y-axis stator 480 is also inserted into the space between the pair of permanent magnets 22A and 22B arranged in wafer stage main body 28, and Y-axis stator 480 and the pair of permanent magnets 22A and 22B constitute a linear motor that finely drives wafer stage WST along the Y-axis direction.

Further, in openings 30b and 30c formed in counter mass 30, both ends of X-axis stators 461A and 461B in the longitudinal direction, each consisting of an armature unit whose configuration is similar to X-axis stators 61A and 61B previously described, are inserted and fixed (refer to FIG. 14A). Similar to X-axis stators 61A and 61B previously described, X-axis stators 461A and 461B are also inserted into the space between magnetic pole units 23A and 23B and the space between magnetic pole units 23C and 23D arranged in wafer stage main body 28, respectively. That is, X-axis stators 461A and 461B and magnetic pole units 23A to 23D constitute a pair of linear motors that drives wafer stage WST along the X-axis direction.

As is shown in FIG. 14A, inside each of the openings 30d and 30e formed in counter mass 30, X-axis movers 24A and 24B are arranged, each consisting of a pair of magnetic pole units (a permanent magnet group) that extend in the X-axis direction. In the inner space of each of the X-axis movers 24A and 24B, X-axis stators (armature coils) 26A and 26B made up of armature units extending in the X-axis direction that constitute moving body unit MY' as it will be described later are inserted, respectively. X-axis movers 24A and 24B constitute a linear motor (a second drive unit) that drives the counter mass along the X-axis direction.

As is shown in FIG. 15, moving body unit MY' is equipped with X-axis stators 26A and 26B previously described, a first plate shaped member 184 placed at a position equally apart from X-axis stators 26A and 26B in the Y-axis direction under counter mass 30 parallel to the XY plane extending in the X-axis direction, Z-axis stators 89A and 89B placed on both sides of first plate shaped member 184 in the Y-axis direction whose longitudinal direction is the X-axis direction, a second plate shaped member 186 placed on the +Y side of X-axis stator 26B whose longitudinal direction is the X-axis direction, and a slider 44 fixed to one end of X-axis stators 26A and 26B, the first plate shaped member 184, Z-axis stators 89A and 89B, and the second plate shaped member 186 in the longitudinal direction (the end on the +X side) and a slider 46 fixed to the other end of X-axis stators 26A and 26B, the first plate shaped member 184, Z-axis stators 89A and 89B, and the second plate shaped member 186 in the longitudinal direction (the end on the −X side). By sliders 44 and 46, X-axis stators 26A and 26B, the first plate shaped member 184, Z-axis stators 89A and 89B, and the second plate shaped member 186 are maintained in a predetermined positional relationship.

The first plate shaped member 184 has its upper surface (the surface on the +Z side) processed flatly, and is placed under the bottom surface of counter mass 30 as is shown in FIG. 15. Meanwhile, on the bottom surface of counter mass 30 in the center in the Y-axis direction, a member 83 is fixed that has a plurality of static gas bearings (not shown) (e.g. air bearings) arranged at a predetermined spacing on its bottom surface along the X-axis direction. Counter mass 30 is supported in a non-contact manner with respect to each section of moving body unit MY' by the static pressure of the pressurized gas blowing out to the first plate shaped member 184 from the plurality of air bearings.

As is shown in FIG. 14B, self-weight canceller 101 is arranged on the bottom surface of wafer stage WST (wafer stage main body 28). As is shown in FIG. 14B, in counter mass 30, the surface that faces self-weight canceller 101 is a movement surface of wafer stage WST. Because counter mass 30 has the movement surface of wafer stage WST, stage base 71 can be made at a low cost.

In the space between counter mass 30 and wafer stage main body 28, power usage supply unit 155 that has a configuration similar to the unit in the first embodiment is arranged, as is shown in FIG. 15. Power usage supply unit 155 is used as a relay mechanism when supplying pressurized gas supplied from a gas supply unit (not shown) arranged outside the wafer stage unit via gas supply pipe 203 connected to counter mass 30 or supplying negative pressure generated in a vacuum suction unit (not shown) arranged outside the wafer stage unit via vacuum pipe 204 connected to counter mass 30 to wafer stage WST.

Other arrangements of wafer stage unit 12' is similar to wafer stage unit 12 in the first embodiment previously described. Accordingly, forces similar to the first embodiment act between moving body unit MY', Y-axis linear motors $LY_1$ and $LY_2$, stage base 71, and frame caster FC.

In the exposure apparatus of the second embodiment configured in the manner described above, operations similar to the ones described in the first embodiment previously described are performed. However, in the second embodiment, because the exposure apparatus is equipped with counter mass 30, when wafer stage WST is driven in one direction (the +X direction (or the −X direction)) in the X-axis direction, counter mass 30 receives the reaction force and is driven in the opposite direction (the −X direction (or the +X direction)) of wafer stage WST. Further, in order to reduce the movement strokes of counter mass 30, main controller 20 gives an initial velocity to drive counter mass 30 in the same direction as wafer stage WST using X-axis movers 24A and 24B and X-axis stators 26A and 26B that constitute the second drive unit.

The vacuum of wafer holder 25 used in wafer stage WST of wafer stage unit 12, the supply of pressurized gas to self-weight canceller 101, and the supply of pressurized gas used for elevating the center-ups for wafer elevation are performed via counter mass 30 and power usage supply unit 155 arranged in the space between counter mass 30 and wafer stage main body 28. In this case, hollow cylindrical member 234 described in the first embodiment can movably support X-axis solid cylindrical member 232 along the X direction, according to the relative movement amount along the X direction to wafer stage main body 28 and counter mass 30. Similarly, Y support member 237 and Z support member 239 movably support Y-axis solid cylindrical member 236 and Z-axis solid cylindrical member 238, respectively, according to the movement of wafer stage main body 28 in the Y direction and Z direction.

As is described so far, according to wafer stage unit 12' related to the second embodiment, since the unit is equipped with power usage supply unit 155 previously described connecting to wafer stage WST that moves on upper surface 71a of stage base 71, and power usage supply unit 155 is arranged in counter mass 30, decrease in position controllability of the wafer stage due to power usage supply unit 155 can be almost completely prevented as in the first embodiment previously described. Further, in the second embodiment, power usage supply unit 155 supplies fluid (pressurized gas) to wafer stage WST via counter mass 30 which moves in the opposite direction of wafer stage WST by the reaction force when wafer stage WST is driven in the X-axis direction, or more specifically, power usage supply unit 155 performs the supply of fluid to wafer stage WST relaying counter mass 30 arranged close to wafer stage WST, therefore, when the case is compared with when the fluid is supplied to the wafer stage directly from outside the stage unit via piping such as tubes, the resisting force that accompanies the dragging of a tube can be reduced, which makes it possible to improve the position controllability of wafer stage WST.

Further, according to the exposure apparatus of the second embodiment, because wafer stage unit 12' described above is used as the stage unit that moves wafer W serving as a substrate, position controllability of wafer W (wafer stage WST) when performing exposure operation by the step-and-scan method in which the pattern of reticle R is transferred onto a plurality of shot areas on wafer W can be improved, and as a consequence, the pattern of reticle R can be transferred with high precision on wafer W.

In the second embodiment above, the case has been described where the so-called "local counter mass" that surrounds wafer stage WST is used as counter mass 30, however, the present invention is not limited to this, and the configuration does not matter as long as the counter mass moves in the opposite direction of wafer stage WST by the reaction force of the drive of wafer stage WST.

A Modified Example

A modified example of the power usage supply unit is described below, referring to FIGS. 16 to 22.

Figure 16:
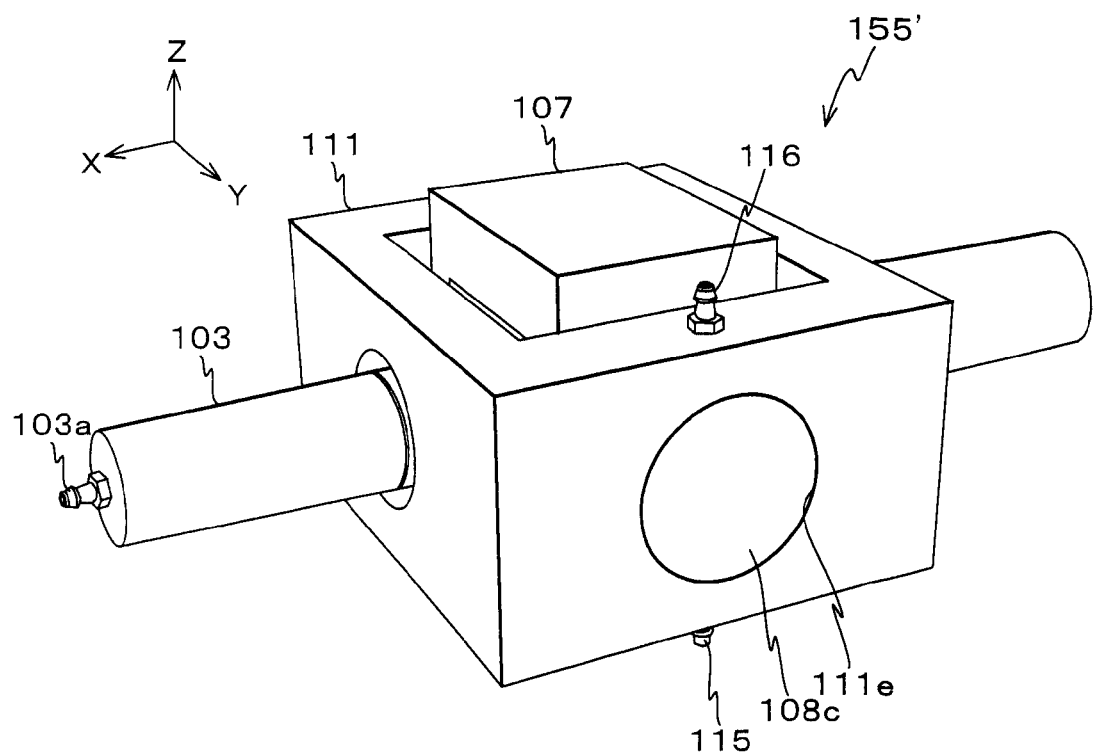
FIG. 16 is a perspective view that shows a power usage supply unit related to a modified example.
Figure 17:
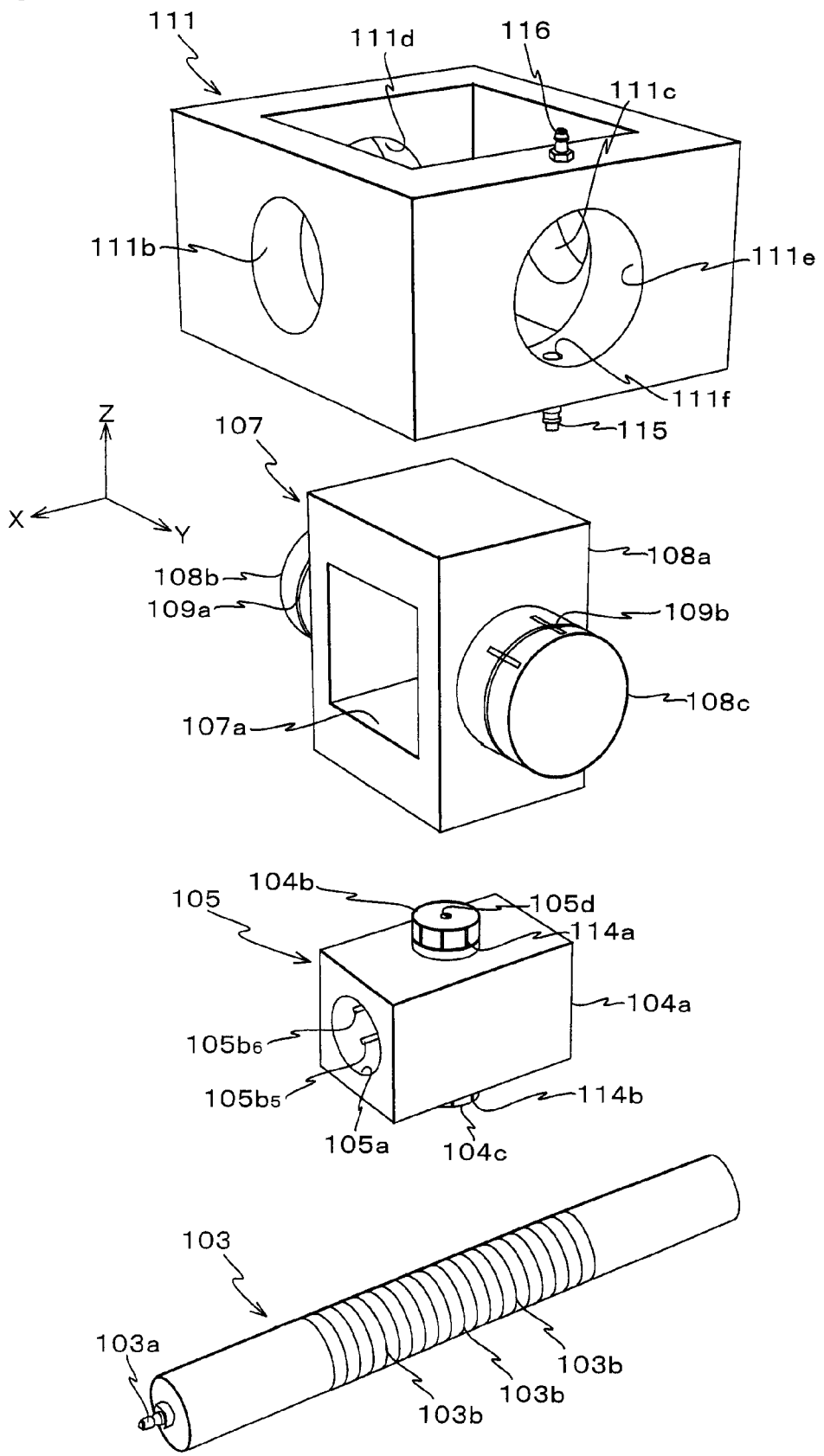
FIG. 17 is an exploded perspective view of the power usage supply unit in FIG. 16.
Figure 18:
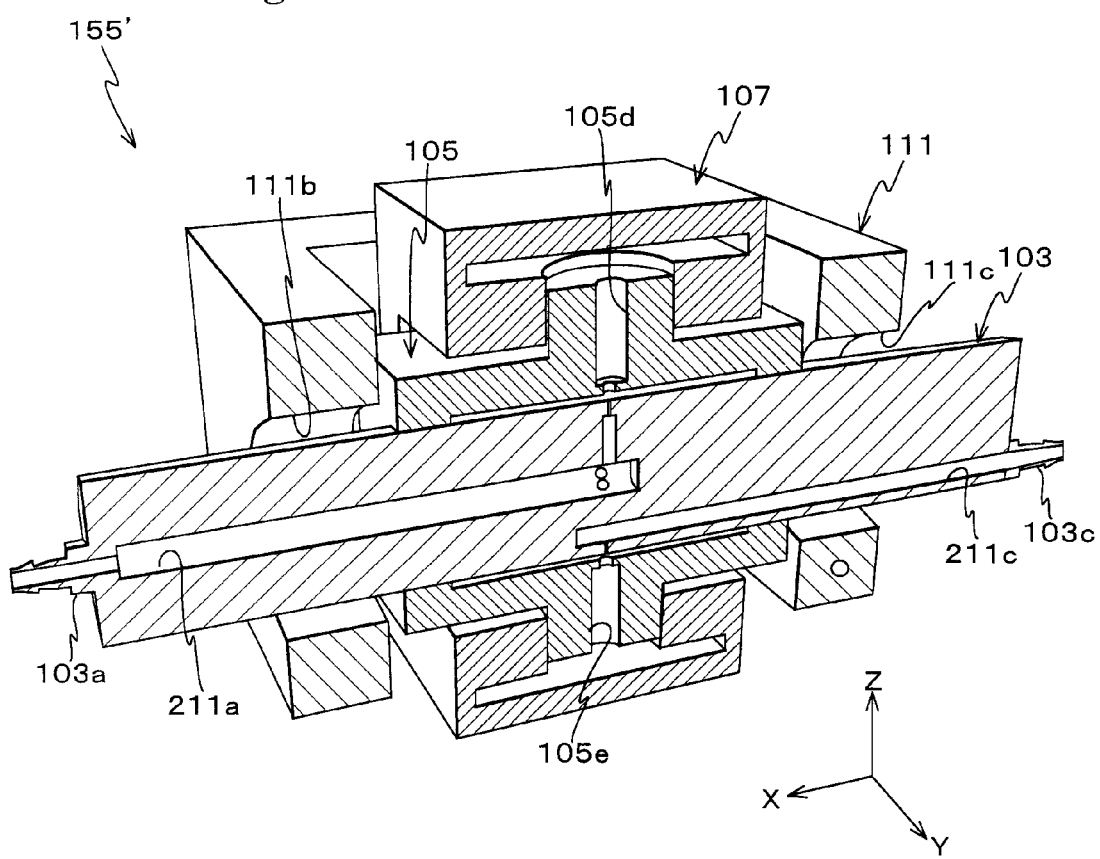
FIG. 18 is a partially sectioned view (No. 1) of the power usage supply unit.
Figure 19:
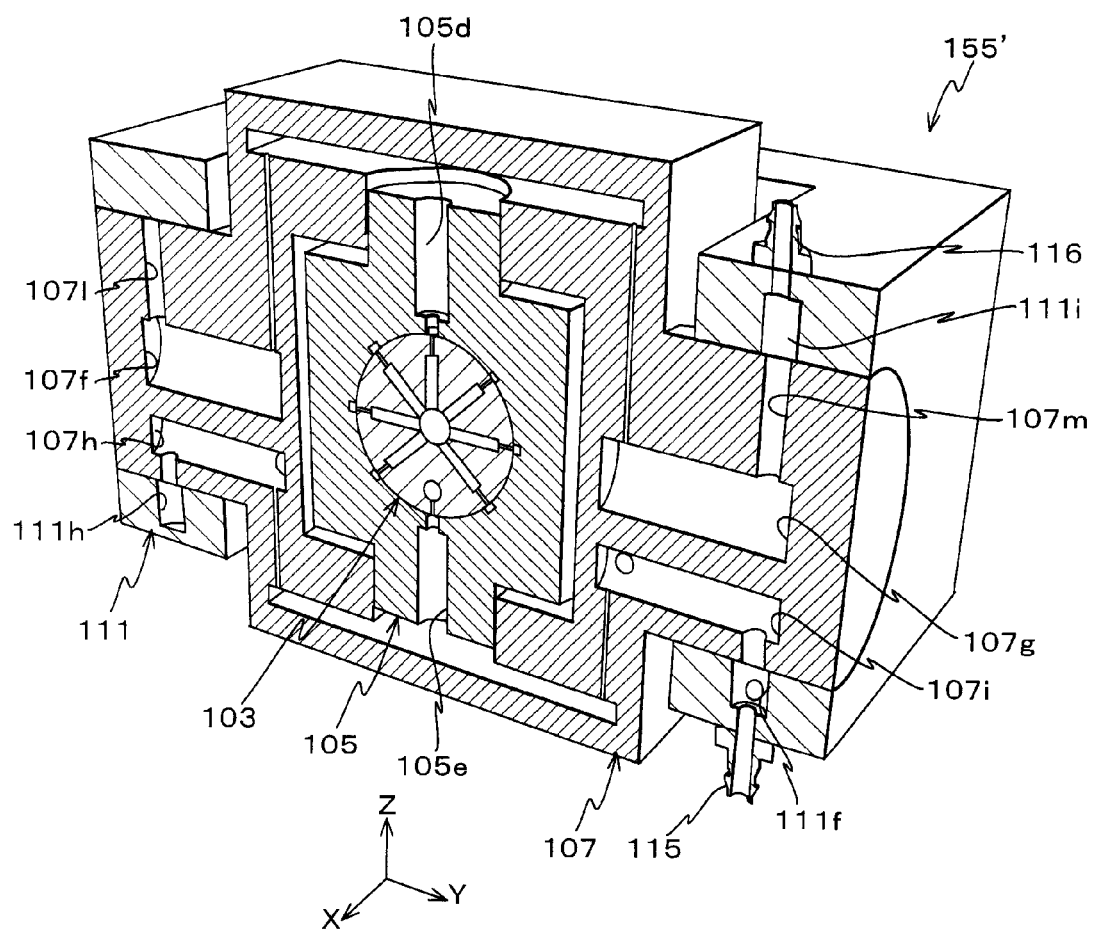
FIG. 19 is a partially sectioned view (No. 2) of the power usage supply unit.
Figure 20:
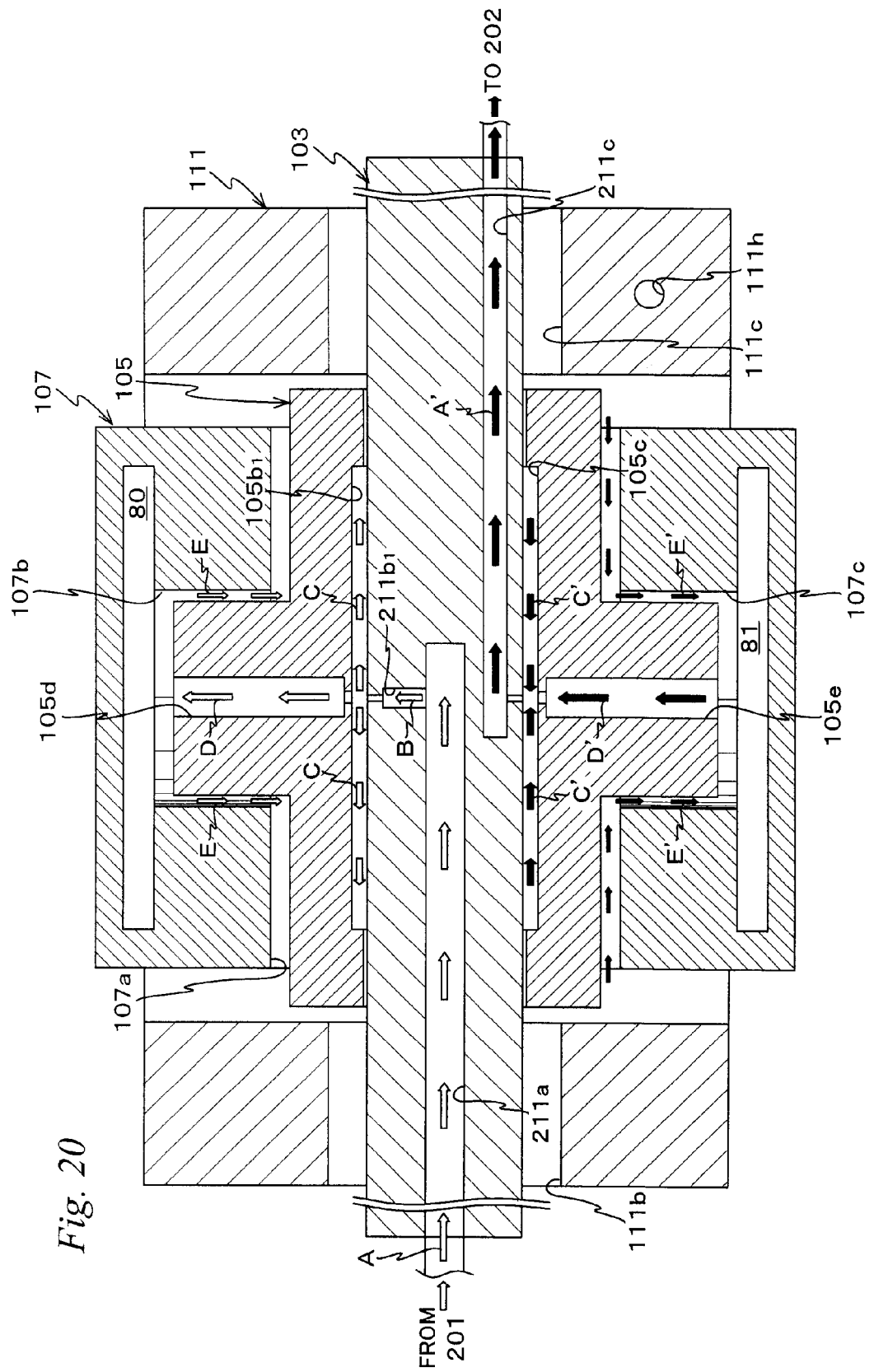
FIG. 20 is a view (No. 1) for describing a gas flow within the power usage supply unit.
Figure 21:
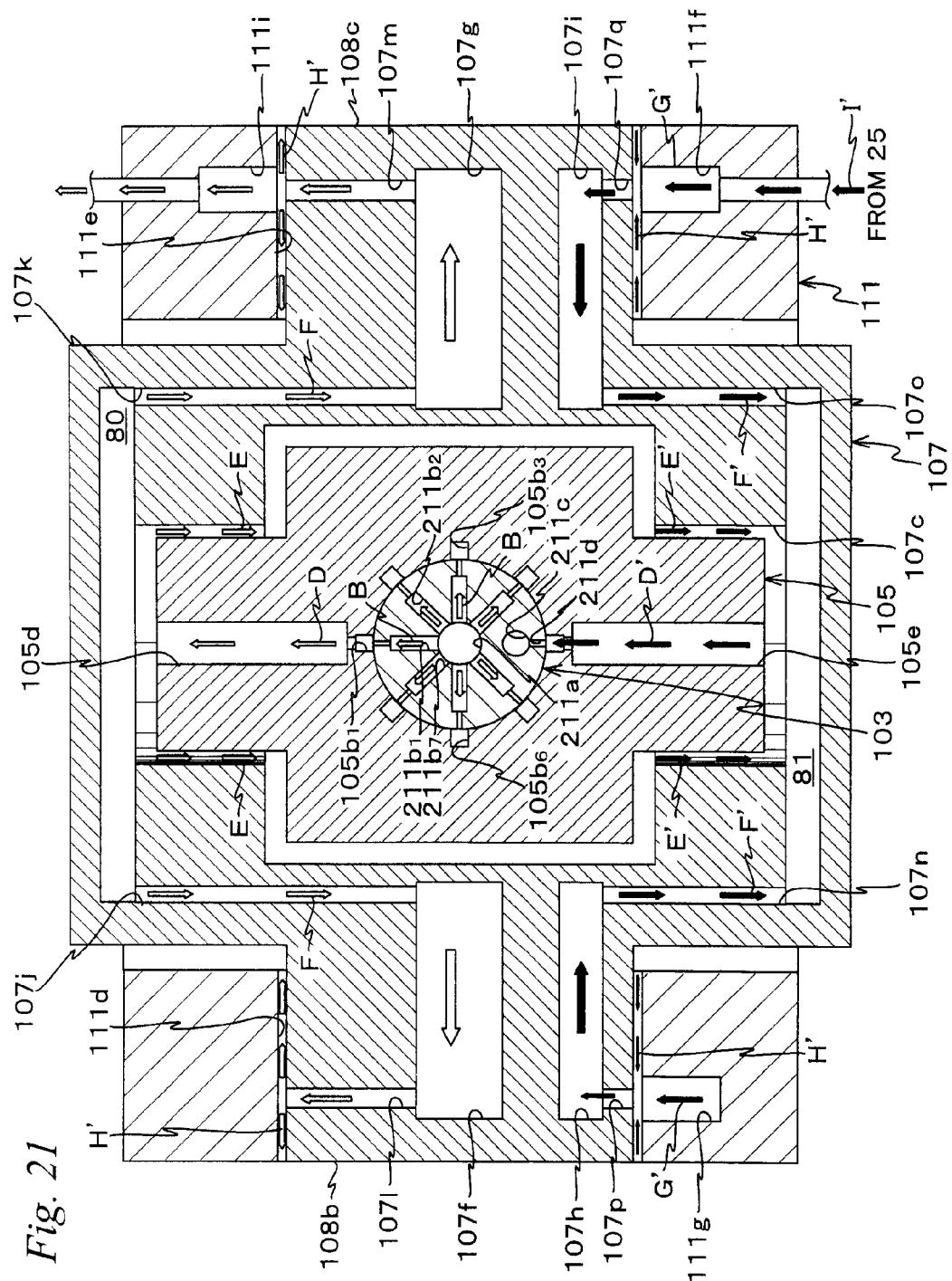
FIG. 21 is a view (No. 2) for describing a gas flow within the power usage supply unit.

FIG. 16 shows a perspective view of a power usage supply unit 155' of the modified example, whereas FIG. 17 shows an exploded perspective view of power usage supply unit 155'. Further, FIG. 18 shows a perspective view of power usage supply unit 155' sectioned in the XZ surface around the center in the Y-axis direction, and FIG. 19 shows a perspective view of power usage supply unit 155' sectioned in the YZ surface around the center in the X-axis direction. Further, FIGS. 20 and 21 are views used for describing the gas flow inside power usage supply unit 155'. Of the drawings, FIG. 20 is a sectional view of power usage supply unit 155' sectioned along corresponding to the same XZ surface in FIG. 18, and FIG. 21 is a sectional view of power usage supply unit 155' sectioned along corresponding to the same YZ surface in FIG. 19.

Power usage supply unit 155' is configured by a combination of four members shown in FIG. 17; a first member 103, a second member 105, a third member 107, and a fourth member 111, serving as a first axis section. Power usage supply unit 155' is incorporated in a stage unit that has counter mass 30 (refer to FIG. 22) as in the second embodiment previously described. FIG. 17 is a view that shows the first to fourth members extracted, in a state assembled as power usage supply unit 155' (the state in FIG. 16), and it is a matter of course that the third member 107 and the fourth member 111 are each actually made of a plurality of components so that other members can be incorporated.

As is shown in FIG. 17, the first member 103 consists of a solid cylindrical member whose longitudinal direction is in the X-axis direction, and on the outer circumferential surface excluding the section on both ends in the longitudinal direction, a plurality of surface throttle grooves 103b of a predetermined depth (ex. a depth of around 10 μm) is formed at a predetermined spacing. On the end section of the first member 103 on the +X side, a connecter section 103a is arranged, and on the end section on the −X side, a connecter section 103c similar to connecter section 103a is arranged (not shown in FIG. 17, refer to FIG. 18). To connecter section 103a, one end of a gas supply pipe (not shown) is connected, and the other end of the gas supply pipe is connected to gas supply unit 201 (refer to FIG. 8) previously described. To connecter section 103c, one end of a vacuum pipe (not shown) is connected, and the other end of the vacuum pipe is connected to vacuum suction unit 202 previously described.

As is shown in FIG. 18, inside the first member 103, a gas supply pipe line 211a that reaches the section slightly to the −X side of the center in the X-axis direction from the edge surface of connecter section 103a and a vacuum pipe line 211c that reaches the section slightly to the +X side of the center in the X-axis direction from the edge surface of connecter section 103c are respectively formed.

The end section of gas supply pipe line 211a on the +X side is formed so that the diameter is slightly smaller than other sections. In the vicinity of the end section of gas supply pipe line 211a on the −X side, seven branched pipe lines $211b_1$ to $211b_7$ that reach the outer circumferential surface of the first member 103 are formed in a radial direction, as is shown in FIGS. 20 and 21. Branched pipe lines $211b_1$ to $211b_7$ are each formed so that the diameter on the outer circumferential side is smaller than other sections.

As is shown in FIG. 21, from the vicinity of the end section on the +X side of vacuum pipe line 211c, a branched pipe line 211d is formed in a state branching downward (to the −X side) and communicating with the outside of the first member 103.

As is shown in FIG. 17, the second member 105 has a first support section 104a that has a rough rectangular solid shape and a pair of second axis sections 104b and 104c that each integrally project in the Z-axis direction on the vertical surface (the surface on the ±Z side) of the first support section 104a.

In the first support section 104a, a through hole 105a is formed that reaches the edge surface on the −X side from the edge surface on the +X side, and the first member 103 is inserted into through hole 105a. As is shown in FIGS. 17, 20, and 21, on the inner circumferential surface of through hole 105a of the first support section, seven groove sections $105b_1$ to $105b_7$ are formed corresponding to the seven branched pipe lines $211b_1$ to $211b_7$ formed in the first member 103. Further, on the inner circumferential surface of through hole 105a of the first support section, a groove section 105c is formed corresponding to branched pipe line 211*d* formed on the vacuum pipe line 211*c* side in the first member 103.

As is shown in FIG. 17, in one of the second axis sections 104*b* (the one positioned at the +Z side), surface throttle grooves 114*a* are formed. Surface throttle grooves 114*a* is configured of a first groove formed along the outer circumferential surface of the second axis section 104*b* and a plurality of second grooves that extend in the Z-axis direction formed at a predetermined spacing along the outer circumferential surface of the second axis section 104*b* in a state communicating with the first groove. Otherwise being vertically symmetric with the second axis section 104*b*, the other second axis section 104*c* (the one positioned at the −Z side) is also configured in the same manner, and surface throttle grooves 114*b* are formed on the outer circumferential surface.

As is shown in FIGS. 20 and 21, inside the second member 105, a through hole 105*d* is formed communicating with groove section 105*b*$_1$ from the center of the upper end surface (the +Z edge surface) of the second axis section 104*b*. The diameter of the section in the vicinity of the lower end section communicating with groove section 105*b*$_1$ is formed smaller than other sections.

Further, in the second member 105, a through hole 105*c* is formed in a state penetrating the second member 105 from the center of the lower end surface (the −Z edge surface) of the second axis section 104*b* to opening 105*a*. The diameter of through hole 105*c* in the vicinity of the upper end section communicating with groove section 105*c* is set smaller than other sections.

As is shown in FIG. 17, the third member 107 has a second support section 108*a* that has a rectangular solid outer shape in which a rectangular opening (almost a square) 107*a* penetrating the third member 107 from the surface on the +X side to the surface on the −X side is formed, and a pair of third axis sections 108*b* and 108*c* that each integrally project on the surface on both sides in the X-axis direction (the surface on the ±X side) of the second support section 108*a*. On the outer circumferential surface of the third axis sections 108 and 108*c*, surface throttle grooves 109*a* and 109*b* are respectively formed.

As is shown in FIGS. 20 and 21, in the second support section 108*a*, a circular opening 107*b* whose axial direction is in the vertical direction is formed in the upper wall surface of opening 107*a*, and a hollow section communicating with the upper end of circular opening 107*b* is formed inside the second support section 108*a*. In the modified example, the second axis section 104*b* previously described is inserted into circular opening 107*b* from below, and in this inserted state, a predetermined clearance is formed between the second axis section 104*b* and the inner circumferential surface of circular opening 107*b*. Further, in the state shown in FIGS. 20, 21 and the like where the second axis section 104*b* is inserted into circular opening 107*b*, a space 80 that serves as a gas chamber 80 is formed on the upper side of the second axis section 104*b* inside the second support section 108*a*. In the description below, space 80 will also be referred to as gas chamber 80.

Further, as is shown in FIGS. 20 and 21, in the second support section 108*a*, a circular opening 107*c* whose axial direction is in the vertical direction is formed in the lower wall surface of opening 107*a*, and a hollow section communicating with the lower end of circular opening 107*c* is formed inside the second support section 108*a*. In the modified example, the second axis section 104*c* previously described is inserted into circular opening 107*c* from above, and in this inserted state, a predetermined clearance is formed between the second axis section 104*c* and the inner circumferential surface of circular opening 107*c*. Further, in the state shown in FIGS. 20, 21 and the like where the second axis section 104*c* is inserted into circular opening 107*c*, a space 81 that serves as a vacuum chamber 81 is formed on the lower side of the second axis section 104*c* inside the second support section 108*a*. In the description below, space 81 will also be referred to as vacuum chamber 81.

As is shown in FIG. 21, inside one of the third axis sections 108*b* of the third member 107, gas paths 107*f* and 107*h* are formed spaced apart vertically at a predetermined distance, and inside the other third axis section 108*c*, gas paths 107*g* and 107*i* are formed spaced apart vertically at a predetermined distance. Gas paths 107*f* and 107*g* each communicate with gas chamber 80 via gas pipe lines 107*j* and 107*k* extending in the Z-axis direction. Further, gas paths 107*h* and 107*i* each communicate with vacuum chamber 81 via gas pipe lines 107*n* and 107*o* that extend in the Z-axis direction. Further, in the third axis section 108*b*, a gas pipe line 107*l* that communicates gas path 107*f* and the outside of the outer circumferential surface of the third axis section 108*b* and a gas pipe line 107*p* that communicates gas path 107*h* and the outside of the outer circumferential surface of the third axis section 108*c* are formed. Further, in the third axis section 108*c*, a gas pipe line 107*m* that communicates gas path 107*g* and the outside of the outer circumferential surface of the third axis section 108*c* and a gas pipe line 107*q* that communicates gas path 107*i* and the outside of the outer circumferential surface of the third axis section 108*c* are formed.

As is shown in FIG. 17, the fourth member 111 is made of a hollow member that is vertically open having a rectangular frame shape in a planar view (when viewed from above), and in the wall on both sides in the X-axis direction, circular openings of a first diameter 111*b* and 111*c* are each formed, and in the wall on both sides in the Y-axis direction, circular openings of a second diameter (larger than the first diameter) 111*d* and 111*e* are formed.

As is obvious from FIG. 21, the third axis sections 108*b* and 108*c* are inserted into circular openings 111*d* and 111*e*, respectively. Meanwhile, into the remaining two circular openings 111*b* and 111*c*, the first member 103 is inserted with a predetermined gap in between.

As is shown in FIGS. 17 and 21, on the lower side of the inner wall surface of circular opening 111*e* of the fourth member 111 at the position facing gas pipe line 107*q* previously described, a vacuum pipe line 111*f* is formed that communicates vertically. Further, as is shown in FIG. 21, on the lower side of the inner wall surface of circular opening 111*d* of the fourth member 111, a depressed section 111*g* is formed at the position facing gas pipe line 107*p* previously described. Depressed section 111*g* and vacuum pipe line 111 are in a communicating state via a gas pipe line 111*h* (refer to FIG. 20) formed inside the fourth member 111. As is shown in FIG. 17, to vacuum pipe line 111*f*, a connecter 115 arranged on the lower surface side of the fourth member is connected.

Further, on the lower side of the inner wall surface of circular opening at the position facing gas pipe line 107*m* previously described, a gas supply pipe line 111*i* is formed that communicates vertically, and a connecter 116 arranged on the upper surface side of the fourth member 111 is connected to gas supply pipeline 111*i*, as is shown in FIGS. 17 and 21.

Figure 22:
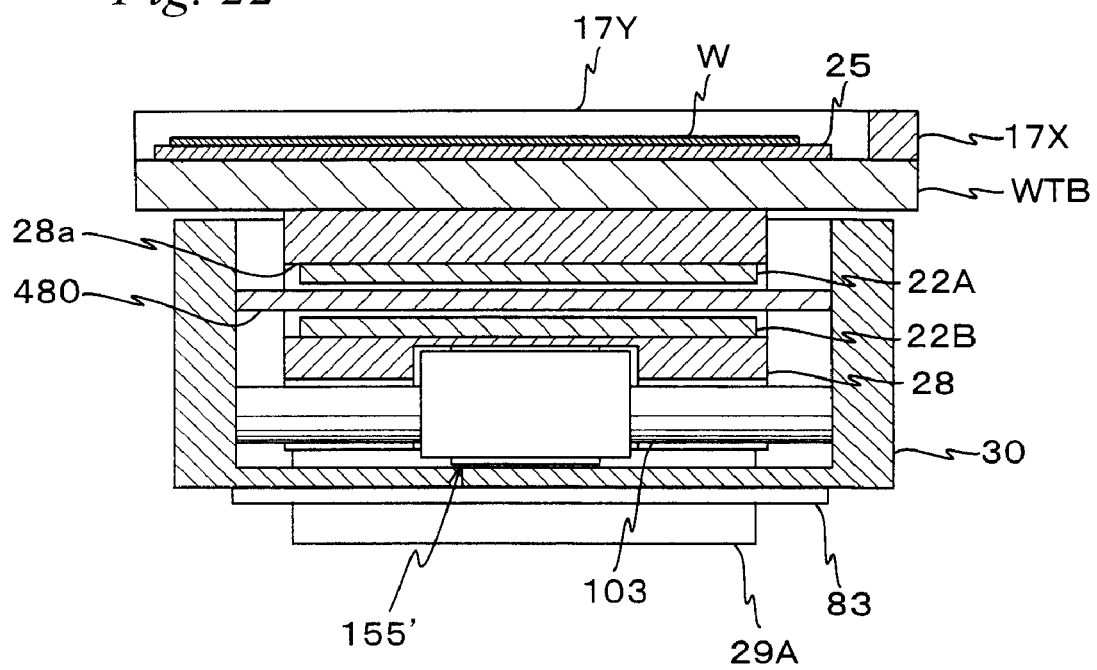
FIG. 22 is a sectional view of a wafer stage and a counter mass in a state where the power usage supply unit related to the modified example is incorporated.

As is shown in FIG. 22, power usage supply unit 155' that has the configuration described above is attached to counter mass 30 and wafer stage WST in a state where both ends of the first member 103 in the longitudinal direction are connected to the side walls of counter mass 30 on both sides in the X-axis direction and the upper end section of the third member is connected to the bottom section of wafer stage main body 28.

And, in the state after the attachment is completed, connecter 115 previously described is connected to a vacuum chuck that constitutes wafer holder 25 arranged on wafer stage WST via a vacuum piping (not shown), and connecter 116 previously described is connected to a gas supply pipe line (not shown) inside wafer stage main body 28 via a piping (not shown).

Next, the operation of power usage supply unit 155' configured in the manner described above will be described, referring to FIGS. 20 and 21. In FIGS. 20 and 21, the outlined arrows indicate the gas flow due to the supply of pressurized gas, and the black arrows indicate the gas flow caused by the vacuum suction (vacuum).

When the pressurized gas is supplied from gas supply unit 201 into gas supply pipe line 211a inside the first member 103 via a supply pipe (not shown) and connecter section 103a connecting to counter mass 30 as is indicated by arrow A in FIG. 20, the pressurized gas flows (rises) in the direction indicated by arrow B within branched pipe line $211b_1$, and the pressurized gas also flows within the other branched pipe lines $211b_2$ to $211b_7$ in the direction indicated by arrow B toward the outside of the outer circumferential surface of the first member 103 as is shown in FIG. 21. Then, most of the pressurized gas that flows within branched pipe line $211b_1$ flows in the direction indicated by arrow D in through hole 105d and is supplied to gas chamber 80 previously described, and the remaining gas flows in the direction indicated by arrow C within groove section $105b_1$ formed in the second member 105 as is shown in FIG. 20, and the pressurized gas is filled into the space made with groove section $105b_1$ and the first member 103. Further, also in groove sections $105b_2$ to $105b_7$, pressurized gas flows in the same direction as arrow C, and the pressurized gas is filled into the space made with groove sections $105b_2$ to $105b_7$ and the first member 103. And, the pressurized gas also flows within surface throttle grooves 103b formed on the surface of the first member 103. In this case, similar to the first embodiment previously described, the first member 103 is supported in a non-contact manner with respect to the first support section 104a of the second member 105 by the static pressure of the pressurized gas in the gap between surface throttle grooves 103b and the second member 105. That is, in the manner described above, a type of static gas bearing is configured in the entire area of surface throttle grooves 103b. As a consequence, the first member 103 is in a state where movement in the X-axis direction and the rotational direction around the X-axis of the first member 103 with respect to the first support section 104a is permissible.

Meanwhile, the inside of gas chamber 80 is filled with the pressurized gas supplied in the manner previously described, and a part of the pressurized gas that is filled flows (leaks) in the direction indicated by arrow E in the extremely small gap between opening 107b formed in the third member 107 (the second support section 108a) and the second axis section 104b of the second member 105 as is shown in FIG. 20. Accordingly, as is previously described, a type of static gas bearing is configured in the entire area of surface throttle grooves 114a formed in the second axis section 104b, and the second axis section 104b is in a state where movement in the Z-axis direction and the rotational direction around the Z-axis of the second axis section 104b with respect to the second support section 108a is permissible.

As is shown in FIG. 21, a part of the pressurized gas filled inside gas chamber 80 flows in the direction indicated by arrow F (the −Z direction) within gas pipe lines 107j and 107k, sequentially goes through gas paths 107f and 107h and gas pipe lines 107l and 107m and flows out into a gap, which is formed with the fourth member 111 outside the third axis sections 108b and 108c of the third member 107. The pressurized gas flows within surface throttle grooves 109a and 109b (refer to FIG. 17) formed in the third axis sections 108b and 108c of the third member 107, respectively. Accordingly, as is previously described, a type of static gas bearing is configured in the entire area of surface throttle grooves 109a and 109b formed in the third axis sections 108b and 108c, respectively, and the third axis sections 108b and 108c are in a state where movement in the Y-axis direction and the rotational direction around the Y-axis of the third axis sections 108b and 108c with respect to the fourth support member 111 is permissible.

Further, the pressurized gas that flows outside the third axis section 108c via gas pipe line 107m is sent to the inside of wafer stage main body 28 via gas supply pipe line 111i formed in the fourth member 111 facing gas pipe line 107m, and is supplied, for example, to self-weight canceller 101 previously described, as well as to the elevating mechanism (not shown) that elevates vertical movement pins (center-ups) arranged in wafer holder 25 for elevating wafer W.

When vacuum operation by vacuum suction unit 202 begins and negative pressure is generated, the negative pressure is supplied to vacuum pipe line 211c via a vacuum pipe connecting to connecter section 103c of the first member 103, and a gas flow indicated by arrow A' in FIG. 20 occurs in vacuum pipe line 211c. By the negative pressure caused by the gas flow, the gas inside vacuum chamber 81 is suctioned to the vacuum pipe line 211c side, and a gas flow indicated by arrow D' in FIG. 20 occurs inside through hole 105e, as well as a gas flow indicated by arrow C' in FIG. 20 occurs in the space formed by the first member 103 and groove 105c formed in the second member 105. And by the latter gas flow, the pressurized gas that flows out into the gap between the first member 103 and the second member 105 via grooves $105b_1$ to $105b_7$ is suctioned along surface throttle grooves 104b of the first member 103 and the pressurized gas smoothly spreads to the entire circumference of surface throttle grooves 104b as is previously described, and the pressurized gas that reaches groove 105c is also recovered.

The gas flow indicated by arrow D' in FIG. 20 that occurs inside through hole 105e described above creates negative pressure (vacuum state) in vacuum chamber 81, and by the negative pressure, a gas flow occurs in the direction indicated by arrow E' in the space formed by the second axis section 104c of the second member 105 and the third member 107 (the second support section 108a) as is shown in FIGS. 20 and 21, and by the gas flowing within surface throttle grooves 114b formed in the second axis section 104c, a type of static gas bearing is configured in the entire area of surface throttle grooves 114b, and the second axis section 104c is in a state where movement in the Z-axis direction and the rotational direction around the Z-axis of the second axis section 104c with respect to the second support section 108a is permissible. Accordingly, power usage supply unit 155' of the modified example has a configuration in which the position and attitude in directions of six degrees of freedom can be changed.

Further, by the negative pressure inside vacuum chamber 81, the gas inside gas paths 107f and 107h are suctioned to vacuum chamber 81, and a gas flow indicated by arrow F' in FIG. 21 occurs in gas pipe lines 107n and 107o. This gas flow creates negative pressure inside gas paths 107f and 107h, and by the negative pressure, a gas flow indicated by arrow G' in FIG. 21 occurs inside vacuum pipe line 111f formed in the fourth member 111 as well as inside depressed section 111g communicating with vacuum pipe line 111f via gas pipe line 111h, and a gas flow indicated by arrow H' in FIG. 21 also occurs in the gap between circular opening 111*d* of the fourth member 111 and the third axis section 108*b* and the gap between circular opening 111*c* and the third axis section 108*c*. And by the latter gas flow, the pressurized gas that flows out into the gap between circular opening 111*d* and the third axis section 108*b* and the gap between circular opening 111*c* and the third axis section 108*c* from gas pipe lines 107*l* and 107*m*, respectively, is suctioned along surface throttle grooves 109*a* and 109*b* of the third axis sections 108*b* and 108*c* and the pressurized gas smoothly spreads to the entire circumference of surface throttle grooves 109*a* and 109*b*, and the pressurized gas that reaches the lowest section of surface throttle grooves 109*a* and 109*b* is also recovered.

By the gas flow indicated by the arrow G', negative pressure is created inside vacuum pipe line 111*f*, and by the negative pressure, a gas flow occurs indicated by arrow I' in FIG. 21 in the vacuum pipe connecting the vacuum chuck of wafer holder 25 and the fourth member 111, and wafer W is suctioned by vacuum chucking.

As is described above, power usage supply unit 155' of the modified example has six degrees of freedom, and because fluid (pressurized gas) supply can be performed via the counter mass according to power usage supply unit 155', the same effects as in the second embodiment previously described can be obtained.

Also in the modified example above, an arrangement that employs a tube carrier as in the first embodiment can be employed.

In the modified example above, the fourth member 111 of power usage supply unit 155' does not have to be arranged. In this case, although the degrees of freedom of the power usage supply unit will be four degrees of freedom, a highly precise stage control can be performed when compared with the case where piping (tubes) are employed.

In each of the embodiments above and in the modified example, the case has been described where the stage unit of the present invention is employed in a wafer stage unit, however, the stage unit can also be employed in a reticle stage unit that includes reticle stage RST.

In each of the embodiments above and in the modified example, the case has been described where the present invention is applied to a scanning stepper, however, the scope of the present invention is not limited to this, and the present invention can also be suitably applied to a static type exposure apparatus such as a stepper that performs exposure in a state where the mask and the substrate are static. Further, the present invention can also be suitably applied to an exposure apparatus by the step-and-stitch method.

The object serving as the subject for exposure of the exposure apparatus is not limited to a wafer for manufacturing semiconductors as in the embodiments above, and it can also be a square shaped glass plate for manufacturing display units such as a liquid crystal display, a plasma display, and an organic EL, a thin film magnetic head, an imaging device (such as CCDs), and a substrate for manufacturing a mask or a reticle.

Further, in each of the embodiments above and in the modified example, as illumination light IL of the exposure apparatus, the light is not limited to light having the wavelength equal to or greater than 100 nm, and it is needless to say that light having the wavelength less than 100 nm can also be used. For example, in recent years, in order to expose a pattern equal to or less than 70 nm, development is performed of an EUV exposure apparatus that makes an SOR or a plasma laser as a light source generate an EUV (Extreme Ultraviolet) light in a soft X-ray range (such as a wavelength range from 5 to 15 nm), and uses a total reflection reduction optical system designed under the exposure wavelength (such as 13.5 nm) and the reflective type mask. Furthermore, for example, the present invention can also be suitably applied to an immersion exposure apparatus that has liquid (e.g. pure water or the like) filled in between projection optical system PL and a wafer whose details are disclosed in, for example, the pamphlet of International Publication WO99/49504 and the like.

Further, the present invention can also be applied to an exposure apparatus that uses a charged particle beam such as an electron beam or an ion beam. Incidentally, the electron beam exposure apparatus can be an apparatus by any one of a pencil beam method, a variable-shaped beam method, a self-projection method, a blanking aperture array method, and a mask projection method.

The stage unit related to the present invention can be applied not only to an exposure apparatus, but can also be widely applied to other substrate processing units (e.g. a laser repair unit, a substrate inspection unit or the like), or to a position unit of a sample in other precision machinery, a wire bonding apparatus or the like.

The exposure apparatus related to the present invention such as exposure apparatus 100 or the like in the embodiments described above can be made by incorporating an illumination unit made up of a plurality of lenses, a projection optical system and the like into the main body of the exposure apparatus, and then performing optical adjustment. Then, parts described above such as the X-axis stator, the X-axis mover, the Y-axis stator, the wafer stage, the reticle stage, and other various parts are also mechanically and electrically combined and adjusted. And then, total adjustment (such as electrical adjustment and operation check) is performed, which completes the making of the exposure apparatus. The exposure apparatus is preferably built in a clean room where conditions such as the temperature and the degree of cleanliness are controlled.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the mask is transferred onto a photosensitive object by the exposure apparatus described in the embodiments above; a device assembly step (including processes such as dicing process, bonding process, and packaging process); inspection step, and the like. In this case, in the lithography step, because the exposure apparatus in the embodiments above is used, high integration devices can be manufactured with good yield.

INDUSTRIAL APPLICABILITY

As is described above, the stage unit in the present invention is suitable for making the stage move along a movement surface. Further, the exposure apparatus and the exposure method are suitable for forming a pattern by exposing a substrate.

What is claimed is:
1. A stage device that has a stage which moves on a movement surface and a power usage supply unit which supplies power usage to the stage wherein
the power usage supply unit comprises:
a first axis section that extends in a direction of a first axis within the movement surface;
a first support section that movably supports the first axis section in the direction of the first axis and around the first axis;

a second axis section that extends in a direction of a second axis intersecting with the first axis;
a second support section that movably supports the second axis section in the direction of the second axis and around the second axis; and
a movable member which moves along the direction of the second axis according to the movement of the stage, wherein
the power usage is supplied to the stage from the movable member via the first support section and the second support section.

2. The stage device of claim 1 wherein
the power usage supply unit further comprises:
a third axis section that extends in a direction of a third axis intersecting with the first axis and the second axis; and
a third support section that movably supports the third axis section in the direction of the third axis and around the third axis.

3. The stage device of claim 2 wherein
between the first axis section and the first support section, the second axis section and the second support section, and the third axis section and the third support section, a first, second, and third static gas bearings are arranged, respectively.

4. The stage device of claim 2 wherein
the first support section is disposed closer to the stage side than the second support section along a supply path of the power usage.

5. The stage device of claim 2 wherein
the second support section is connected to the movable member.

6. The stage device of claim 1 wherein
the power usage supply unit is arranged in a carrier that moves in a constant speed along the direction of the first axis.

7. The stage device of claim 1 wherein
between the first axis section and the first support section, and the second axis section and the second support section, first and second static gas bearings are arranged, respectively.

8. The stage device of claim 1 wherein
the power usage supply unit has a suction unit.

9. The stage device of claim 8 wherein
the suction unit suctions liquid on the stage.

10. The stage device of claim 1, further comprising:
a drive unit that drives the stage, wherein
the power usage supply unit supplies the drive unit a temperature adjustment fluid used to adjust the temperature of the drive unit.

11. The stage device of claim 10 wherein
the drive unit has a magnet arranged in the opening section of the stage.

12. The stage device of claim 1 wherein
the stage device has a plurality of power usage supply units.

13. An exposure apparatus that transfers a pattern of a mask mounted on a stage device onto a substrate wherein
a stage device according to claim 1 is used as the stage device.

14. A device manufacturing method that includes a lithography process in which a device pattern is transferred onto a substrate using the exposure apparatus according to claim 13.

15. An exposure apparatus that forms a pattern by exposing a substrate mounted on a stage device wherein
a stage device according to claim 1 is used as the stage device.

16. A device manufacturing method that includes a lithography process in which a device pattern is formed by exposing a substrate using the exposure apparatus according to claim 15.

17. An exposure method in which a pattern is formed by exposing a substrate on a stage with a unit comprising a power usage supply unit that supplies power usage to the stage which moves within a two dimensional plane wherein
the power usage supply unit is moved in a first axis direction within the two dimensional plane and also around the first axis,
the power usage supply unit is moved in a second axis direction intersecting with the first axis and also around the second axis, and
the method comprises:
moving a movable member along the second axis direction according to the movement of the stage; and
supplying the power usage to the stage from the movable member via a first support section and a second support section.

18. The exposure method of claim 17 wherein
the power usage supply unit substantially does not provide any resisting force to the stage.

19. The exposure method of claim 17 wherein
the power usage supply unit moves in a third axis direction intersecting with the first axis direction and the second axis direction and also around the third axis.

20. The exposure method of claim 17 wherein
the power usage supply unit suctions liquid on the stage.

21. The exposure method of claim 20 wherein
the suction of the liquid is performed after completion of an exposure operation.

22. The exposure method of claim 17 wherein
the power usage supply unit supplies a drive unit that drives the stage, with a temperature adjustment fluid used to adjust the temperature of the drive unit.

23. A device manufacturing method that includes a lithography process in which a device pattern is formed by exposing a substrate using the exposure method according to claim 17.

24. A stage device comprising:
a stage relatively movable with respect to a movement surface in four or more degrees of freedom; and
a power usage supply unit that supplies power usage to the stage wherein
the power usage supply unit includes
a moving section that has a supply member which supplies the power usage and is relatively movable to the movement surface independent from the stage;
a first unit that has a first member movable in a direction of a first axis and a second member that has a section opposing the first member and can relatively move with respect to the first member in at least two or more degrees of freedom including the direction of the first axis as one degree of freedom, and performs the delivery of the power usage between the first member and the second member; and
a second unit arranged between the moving section and the second member that allows relative movement between the moving section and the second member in directions of remaining directions of freedom when the at least two degrees are excluded from the four degrees of freedom, and performs the delivery of the power usage between the supply member and the second member; and
a movable member which moves along a direction of a second axis intersecting with the first axis according to the movement of the stage, wherein the power usage is supplied to the stage from the movable member via a first support section and a second support section.

25. The stage device of claim 24 wherein
the stage relatively moves in six degrees of freedom with respect to the movement surface, and
the first member and the second member relatively moves in two degrees of freedom.

26. The stage device of claim 24 wherein
a first static gas bearing is arranged in the opposing section between the first member and the second member.

27. The stage device of claim 24 wherein
the moving section is arranged with a carrier that constantly moves along a direction of the first axis.

28. The stage device of claim 24 wherein
the first member is fixed to the stage.

29. The stage device of claim 24 wherein
the first member includes a first axis section that extends in a direction of the first axis, and
the second member includes the first support section that movably supports the first axis section in a direction of the first axis and the direction around the first axis whereby
the second unit includes a second axis section that extends in a direction of a second axis intersecting the first axis and the second support section that movably supports the second axis section in a direction of the second axis and the direction around the second axis.

30. The stage device of claim 29 wherein
the second unit further includes a third axis section that extends in a direction of a third axis intersecting the first axis and the second axis and a third support section that movably supports the third axis section in a direction of the third axis and the direction around the third axis.

31. An exposure apparatus that transfers a pattern of a mask mounted on a stage device onto a substrate wherein
a stage device according to claim 24 is used as the stage device.

32. An exposure apparatus that forms a pattern by exposing a substrate mounted on a stage device wherein
a stage device according to claim 24 is used as the stage device.

33. A device manufacturing method that includes a lithography process in which a device pattern is transferred onto a substrate using the exposure apparatus according to claim 31.

34. A device manufacturing method that includes a lithography process in which a device pattern is formed by exposing a substrate using the exposure apparatus according to claim 32.

35. The stage device of claim 24 wherein
the first support section is disposed closer to the stage side than the second support section along a supply path of the power usage.

36. The stage device of claim 24 wherein
the second support section is connected to the movable member.

* * * * *